United States Patent
Jeong et al.

(10) Patent No.: US 12,374,383 B2
(45) Date of Patent: Jul. 29, 2025

(54) MEMORY DEVICE ADJUSTING SKEW OF MULTI-PHASE CLOCK SIGNALS, MEMORY CONTROLLER CONTROLLING THE MEMORY DEVICE, AND OPERATING METHOD OF THE MEMORY DEVICE

(71) Applicant: Samsung Electronics Co., Ltd., Suwon-si (KR)

(72) Inventors: Jaewoo Jeong, Suwon-si (KR); Yonghun Kim, Suwon-si (KR); Kihan Kim, Suwon-si (KR); Changsik Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 135 days.

(21) Appl. No.: 18/326,657

(22) Filed: May 31, 2023

(65) Prior Publication Data
US 2024/0144991 A1    May 2, 2024

(30) Foreign Application Priority Data
Oct. 27, 2022    (KR) .......................... 10-2022-0140509

(51) Int. Cl.
| | | |
|---|---|---|
| *G11C 11/4076* | (2006.01) | |
| *G06F 1/10* | (2006.01) | |
| *G06F 1/12* | (2006.01) | |

(52) U.S. Cl.
CPC ............ *G11C 11/4076* (2013.01); *G06F 1/10* (2013.01); *G06F 1/12* (2013.01)

(58) Field of Classification Search
CPC .................................................. G11C 11/4076

USPC ..................................................... 365/233.13
See application file for complete search history.

(56) References Cited

U.S. PATENT DOCUMENTS

| | | | |
|---|---|---|---|
| 6,874,097 B1 * | 3/2005 | Aliahmad ................. | G06F 1/10 |
| | | | 713/401 |
| 7,840,831 B2 | 11/2010 | Jang | |
| 8,138,799 B2 | 3/2012 | Hayashi | |
| 9,722,590 B1 | 8/2017 | Usugi et al. | |
| 10,237,052 B1 | 3/2019 | Moscone | |
| 10,361,690 B1 * | 7/2019 | Addepalli ................. | G06F 1/06 |
| 10,715,127 B2 | 7/2020 | Gans | |

(Continued)

FOREIGN PATENT DOCUMENTS

| | | |
|---|---|---|
| KR | 100763849 B1 | 10/2007 |
| KR | 10-2021-0078572 A | 6/2021 |

*Primary Examiner* — Muna A Techane
(74) *Attorney, Agent, or Firm* — Harness, Dickey & Pierce, P.L.C.

(57) ABSTRACT

A memory device includes a multi-phase clock generator configured to generate first to N-th clock signals having N different phases based on a clock signal from the memory controller, and a monitoring clock signal generator configured to generate a monitoring clock signal having a logic state corresponding to a data pattern in synchronization with edges of the first to N-th clock signals, wherein the monitoring clock signal includes a first monitoring clock signal configured to detect a skew between the first and third clock signals in a first step of a training operation, a second monitoring clock signal configured to detect a skew between the second and fourth clock signals in a second step of the training operation, and a third monitoring clock signal configured to detect a skew between the first and second clock signals in a third step of the training operation.

20 Claims, 29 Drawing Sheets

(56) References Cited

U.S. PATENT DOCUMENTS

| | | |
|---|---|---|
| 10,972,108 B1 | 4/2021 | Li et al. |
| 11,005,466 B2 | 5/2021 | Ashtiani et al. |
| 11,341,002 B1 | 5/2022 | Izad et al. |
| 2021/0358534 A1 | 11/2021 | Choi et al. |
| 2023/0035176 A1* | 2/2023 | Jeong .................. G11C 11/4076 |
| 2023/0360689 A1* | 11/2023 | Park .................... G11C 11/4076 |
| 2023/0386600 A1* | 11/2023 | Lee ........................ G11C 29/52 |

* cited by examiner

FIG. 3B

|  | No Flip | | | | Flip | | | |
|---|---|---|---|---|---|---|---|---|
|  | D0 | D90 | D180 | D270 | D0 | D90 | D180 | D270 |
| STEP1 | 1 | 1 | 0 | 0 | 0 | 0 | 1 | 1 |
| STEP2 | 0 | 1 | 1 | 0 | 1 | 0 | 0 | 1 |
| STEP3 | 1 | 0 | 1 | 0 | 0 | 1 | 0 | 1 |

< No Flip >    SA code = −7

< Flip >

< No Flip >   SA code = −1

< Flip >

< No Flip >   SA code = 0

< Flip >

< No Flip >   SA code = +7

< Flip >

FIG. 8

STEP 1

| SA code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 0 | 0 | 1 | 1 | 1 | 1 | 1 | 1 | 1 | 1 |
| Flip | 0 | 0 | 0 | 0 | 0 | 0 | 0 | 0 | 1 | 1 | 1 | 1 | 1 | 1 | 1 |

< No Flip >  SA code = −7

< Flip >

< No Flip >     SA code = +1

< Flip >

FIG. 10

STEP 1

| SA code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 1 | 1 | 1 | 1 | 1 | 1 | 1 | 1 | 1 | 1 |
| Flip | 0 | 0 | 0 | 0 | 0 | 0 | 0 | 0 | 1 | 1 | 1 | 1 | 1 | 1 | 1 |

FIG. 11A

STEP 2

| SA code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 0 | 0 | 1 | 1 | 1 | 1 | 1 | 1 | 1 | 1 |
| Flip | 0 | 0 | 0 | 0 | 0 | 0 | 0 | 0 | 1 | 1 | 1 | 1 | 1 | 1 | 1 |

FIG. 11B

STEP 2

| SA code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 0 | 0 | 1 | 1 | 1 | 1 | 1 | 1 | 1 | 1 |
| Flip | 0 | 0 | 0 | 0 | 0 | 0 | 0 | 0 | 0 | 0 | 0 | 0 | 1 | 1 | 1 |

FIG. 12A

STEP 3

| DA code | −7 | −6 | −5 | −4 | −3 | −2 | −1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 0 | 0 | 1 | 1 | 1 | 1 | 1 | 1 | 1 | 1 |
| Flip | 0 | 0 | 0 | 0 | 0 | 0 | 0 | 0 | 1 | 1 | 1 | 1 | 1 | 1 | 1 |

FIG. 12B

STEP 3

| DA code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| No Flip | 0 | 0 | 0 | 0 | 0 | 0 | 0 | 0 | 1 | 1 | 1 | 1 | 1 | 1 | 1 |
| Flip | 0 | 0 | 0 | 0 | 0 | 0 | 0 | 0 | 0 | 1 | 1 | 1 | 1 | 1 | 1 |

|  | No Flip ||||||||  Flip ||||||||
|---|---|---|---|---|---|---|---|---|---|---|---|---|---|---|---|---|
|  | D1 | D2 | D3 | D4 | D5 | D6 | D7 | D8 | D1 | D2 | D3 | D4 | D5 | D6 | D7 | D8 |
| STEP 1 | 1 | 1 | 1 | 1 | 0 | 0 | 0 | 0 | 0 | 0 | 0 | 0 | 1 | 1 | 1 | 1 |
| STEP 2 | 0 | 1 | 1 | 1 | 1 | 0 | 0 | 0 | 1 | 0 | 0 | 0 | 0 | 1 | 1 | 1 |
| STEP 3 | 0 | 0 | 1 | 1 | 1 | 1 | 0 | 0 | 1 | 1 | 0 | 0 | 0 | 0 | 1 | 1 |
| STEP 4 | 0 | 0 | 0 | 1 | 1 | 1 | 1 | 0 | 1 | 1 | 1 | 0 | 0 | 0 | 0 | 1 |
| STEP 5 | 1 | 1 | 0 | 0 | 1 | 1 | 0 | 0 | 0 | 0 | 1 | 1 | 0 | 0 | 1 | 1 |
| STEP 6 | 0 | 1 | 1 | 0 | 0 | 1 | 1 | 0 | 1 | 0 | 0 | 1 | 1 | 0 | 0 | 1 |
| STEP 7 | 1 | 0 | 1 | 0 | 1 | 0 | 1 | 0 | 0 | 1 | 0 | 1 | 0 | 1 | 0 | 1 |

MEMORY DEVICE ADJUSTING SKEW OF MULTI-PHASE CLOCK SIGNALS, MEMORY CONTROLLER CONTROLLING THE MEMORY DEVICE, AND OPERATING METHOD OF THE MEMORY DEVICE

CROSS-REFERENCE TO RELATED APPLICATION

This application is based on and claims priority under 35 U.S.C. § 119 to Korean Patent Application No. 10-2022-0140509, filed on Oct. 27, 2022, in the Korean Intellectual Property Office, the disclosure of which is incorporated by reference herein in its entirety.

BACKGROUND

The inventive concepts relate to a memory device and a memory controller, and more particularly, to a memory device configured to adjust a skew of multi-phase clock signals, a memory controller configured to control the memory device, and an operating method of the memory device.

Memory devices, such as low power double data rate (LPDDR) synchronous dynamic random access memory (SDRAM) or the like, may be mainly used in various types of electronic devices, such as smart phones, tablet personal computers (PC), ultra books, or the like.

A memory device may operate according to various specifications, such as an LPDDR specification, DDRx, or the like. The memory device may receive a certain clock signal from a memory controller and generate multi-phase clock signals by using the received clock signal, and may receive write data or transmit read data from/to the memory controller by using the generated multi-phase clock signals. However, when there is a skew in the multi-phase clock signals, errors may occur during data transmission and reception, and in particular, the possibility of occurrence of an error may be further increased in a memory device operating at higher speed.

SUMMARY

The inventive concepts provide a memory device capable of accurately adjusting a skew of multi-phase clock signals in a training process for the multi-phase clock signals, a memory controller, and an operating method of the memory device.

According to an aspect of the inventive concepts, there is provided a memory device including a memory cell array including a plurality of memory cells, a multi-phase clock generator configured to generate first to N-th clock signals having N different phases, based on a clock signal provided from a memory controller, a monitoring clock signal generator configured to receive a data pattern in a training operation and generate a monitoring clock signal having a logic state corresponding to the data pattern in synchronization with edges of the first to N-th clock signals, wherein the monitoring clock signal reflects skews of the first to N-th clock signals, a duty adjuster configured to adjust a duty of the clock signal from the memory controller based on a duty control code set in the training operation, a skew adjuster configured to adjust a skew of at least one of the first to N-th clock signals based on a skew control code set in the training operation, and a control logic configured to control the training operation of detecting the skews between the first to N-th clock signals, wherein the monitoring clock signal includes a first monitoring clock signal configured to detect a skew between the first clock signal and the third clock signal in a first step of the training operation, a second monitoring clock signal configured to detect a skew between the second clock signal and the fourth clock signal in a second step of the training operation, and a third monitoring clock signal configured to detect a skew between the first clock signal and the second clock signal in a third step of the training operation.

According to another aspect of the inventive concepts, there is provided a memory controller including a clock signal transmitter configured to transmit a clock signal used to generate first to N-th clock signals having N different phases by the memory device, a duty detector which, in a training operation, is configured to receive a monitoring clock signal having a logic state corresponding to a certain data pattern at edge timings of the first to N-th clock signals from the memory device and generate a duty code including at least one bit indicating a result of detecting a duty of the monitoring clock signal, a control code generator configured to generate a duty control code and a skew control code configured to control a duty adjuster and a skew adjuster provided in the memory device, based on the duty code generated in the training operation, and a processor configured to control the training operation including multiple steps with respect to the memory device, wherein the monitoring clock signal has a waveform reflecting skews of the first to N-th clock signals, the skew control code includes information configured to adjust a skew of at least one of the first to N-th clock signals to adjust skews between signals having a phase difference of a first value among the first to N-th clock signals, and the duty control code includes information configured to adjust the duty of the clock signal to adjust skews between signals having a phase difference of a second value among the first to N-th clock signals.

According to another aspect of the inventive concepts, there is provided an operating method of a memory device, the operating method including generating first to fourth clock signals sequentially having a phase difference of 90 degrees based on a clock signal provided from a memory controller, generating a monitoring clock signal in which a logic state transitions according to a data pattern generated in the memory device at edge timings of the first to fourth clock signals during a training operation, and generating a duty code including information indicating skews between the first to fourth clock signals based on a duty monitoring result with respect to the monitoring clock signal during the training operation, wherein the training operation includes a first step of adjusting a skew between the first clock signal and the third clock signal by performing a duty monitoring operation using the monitoring clock signal generated to correspond to a waveform of the first clock signal by using a non-flipped (No Flip) data pattern and a duty monitoring operation using the monitoring clock signal generated to correspond to a waveform of the third clock signal by using a flipped (Flip) data pattern together, a second step of adjusting a skew between the second clock signal and the fourth clock signal by performing a duty monitoring operation using the monitoring clock signal generated to correspond to a waveform of the second clock signal by using the non-flipped (No Flip) data pattern and a duty monitoring operation using the monitoring clock signal generated to correspond to a waveform of the fourth clock signal by using the flipped (Flip) data pattern together, and a third step of adjusting a skew between the first clock signal and the second clock signal and a skew between the third clock signal and the fourth clock signal by performing a duty monitoring operation using the monitoring clock signal generated to correspond to a clock signal from the memory controller by using the non-flipped (No Flip) data pattern and a duty monitoring operation using the monitoring clock signal generated to correspond to an inverted waveform of the clock signal from the memory controller by using the flipped (Flip) data pattern together.

BRIEF DESCRIPTION OF THE DRAWINGS

Example embodiments of the inventive concepts will be more clearly understood from the following detailed description taken in conjunction with the accompanying drawings in which:

FIGS. 3A and 3B are diagrams illustrating an example of generating a data pattern according to example embodiments;

FIGS. 7A, 7B, 7C, 7D, 7E to 12A and 12B are diagrams illustrating waveforms and monitoring results of first to fourth clock signals in a training process;

FIGS. 15 and 16 are diagrams illustrating examples of signals transmitted and received between a memory controller and a memory device; and FIGS. 17A, 17B, and 18 are diagrams illustrating a concept of a training operation according to other example embodiments.

DETAILED DESCRIPTION OF EXAMPLE EMBODIMENTS

Hereinafter, example embodiments of the inventive concepts will be described in detail with reference to the accompanying drawings.

Figure 1:
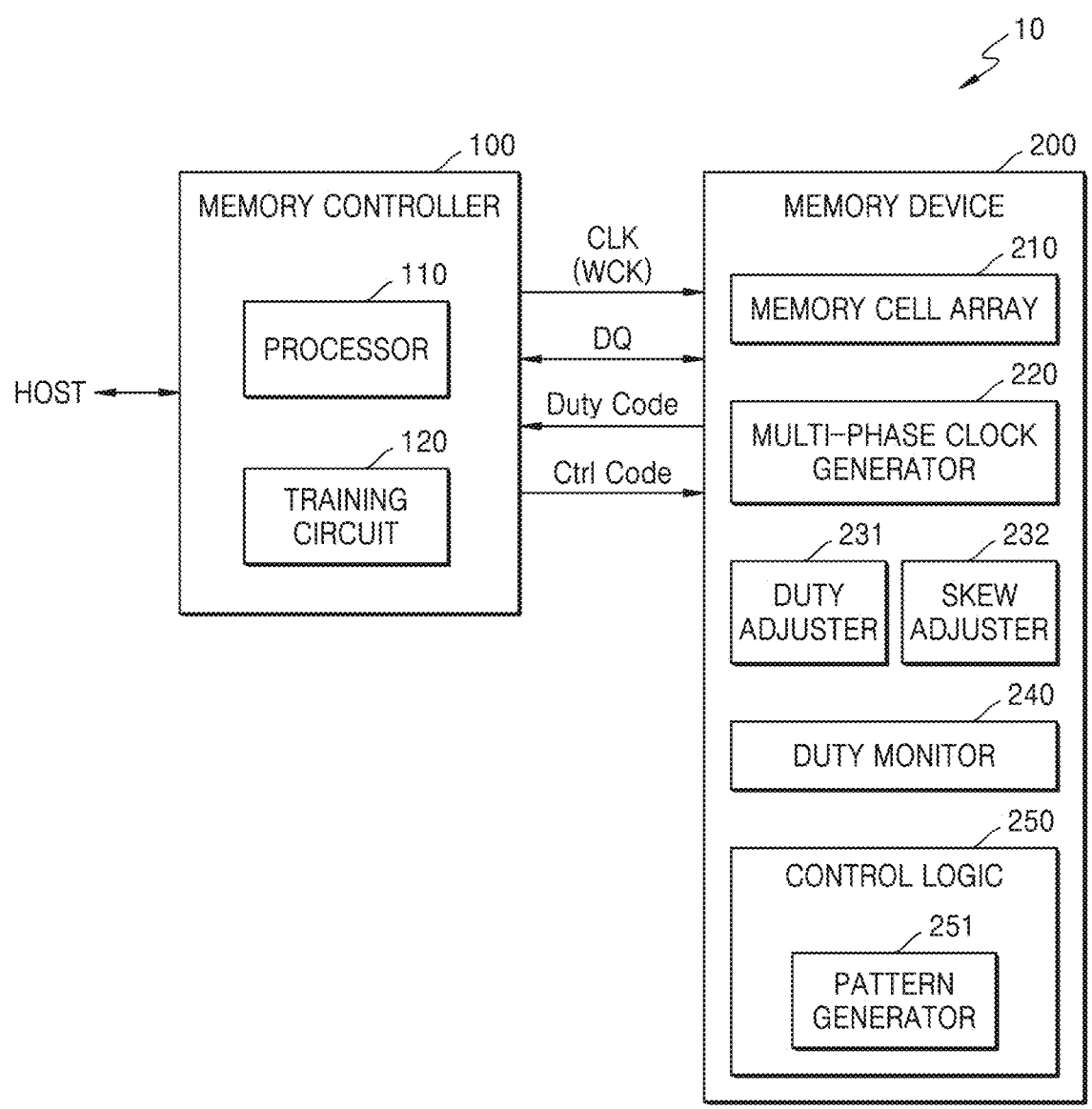
FIG. 1 is a block diagram of a memory system including a memory device according to example embodiments.

FIG. 1 is a block diagram of a memory system including a memory device according to example embodiments.

Referring to FIG. 1, a memory system 10 may include a memory controller 100 and a memory device 200. The memory system 10 may be implemented to be included in a personal computer (PC), a mobile electronic device, or a data server. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), an Internet of Things (IoT) device, an Internet of Everything (IoE) device, or a drone.

The memory controller 100 may be implemented as or included in an integrated circuit (IC), a system on chip (SoC), an application processor (AP), a mobile AP, a chipset, or a set of chips. The memory controller 100 may be a semiconductor device that performs a memory control function. For example, when the memory controller 100 corresponds to an AP, the memory controller 100 may include a memory control logic (not shown), random-access memory (RAM), a central processing unit (CPU), a graphics processing unit (GPU), and/or a modem, or the like.

The memory controller 100 may control the memory device 200 to read data DQ stored in the memory device 200 or write the data DQ to the memory device 200 in response to a write/read request from a host HOST. For example, the memory controller 100 may control write and read operations of the data DQ of the memory device 200 by providing addresses and commands to the memory device 200. Also, the data DQ including write data and read data may be transmitted and received between the memory controller 100 and the memory device 200.

The memory controller 100 may access the memory device 200 in response to a request from the host HOST, and may communicate with the host HOST by using various protocols. For example, the memory controller 100 may communicate with the host HOST by using an interface protocol, such as Peripheral Component Interconnect-Express (PCI-E), Advanced Technology Attachment (ATA), Serial ATA (SATA), Parallel ATA (PATA), or serial attached SCSI (SAS). In addition, various other interface protocols, such as Universal Serial Bus (USB), Multi-Media Card (MMC), Enhanced Small Disk Interface (ESDI), or Integrated Drive Electronics (IDE), may be applied to a protocol between the host HOST and the memory controller 100.

The memory device 200 may be implemented as a volatile memory device. The volatile memory device may be implemented as RAM, dynamic RAM (DRAM), or static RAM (SRAM), but is not limited thereto. For example, the memory device 200 may correspond to double data rate synchronous dynamic RAM (DDR SDRAM), low power double data rate (LPDDR) SDRAM, graphics double data rate (GDDR) SDRAM, Rambus dynamic RAM (RDRAM), or the like. Alternatively, the memory device 200 may also include a high bandwidth memory (HBM).

The memory device 200 may also be implemented as a non-volatile memory device. For example, the memory device 200 may also be implemented as a resistive memory, such as magnetic RAM (MRAM), ferroelectric RAM (FeRAM), resistive RAM (ReRAM), or the like.

Referring to FIG. 1, the memory controller 100 may include a processor 110 and a training circuit 120. The processor 110 may perform overall control in relation to memory operations, and the training circuit 120 may control various training operations for the memory device 200 based on control by the processor 110. For example, when the memory system 10 is initially driven, the training circuit 120 may control a training operation for the memory device 200. The training operation may include training of a read data strobe signal (RDQS) and read data (or skew training between an RDQS and read data), training of a read reference voltage for distinguishing read data, training of a duty cycle of a clock signal CLK, training of a write data strobe signal (WDQS) and write data (or skew training between a WDQS and write data), training of a write reference voltage for distinguishing write data, or the like.

The memory device 200 may include a memory cell array 210, a multi-phase clock generator 220, a duty adjuster 231, a skew adjuster 232, a duty monitor 240, and a control logic 250. When the memory device 200 includes DRAM, the memory cell array 210 may include a plurality of DRAM cells.

The multi-phase clock generator 220 may generate a plurality of clock signals (e.g., multi-phase clock signals) having different phases by using a clock signal CLK provided from the memory controller 100 and synchronize the multi-phase clock signals to an operation of the memory system 10. For example, the memory device 200 may receive data or transmit data by using the multi-phase clock signals each having a lower frequency than that of the clock signal CLK. Accordingly, data is transmitted and received based on a clock having a relatively low frequency compared to that of the clock signal CLK, and thus stable data transmission and reception may be performed.

For example, when the multi-phase clock generator 220 generates four-phase clock signals, the four-phase clock signals may include first to fourth clock signals respectively having a phase difference of 0 degrees, 90 degrees, 180 degrees, and 270 degrees from the clock signal CLK. However, example embodiments are not limited thereto. Regardless of the phase of the clock signal CLK, the first to fourth clock signals may be defined as signals sequentially having a phase difference of 90 degrees. In example embodiments, the four-phase clock signals may have a value of frequency of ½ that of the clock signal CLK, and may be generated in synchronization with rising edges and falling edges of two clocks of the clock signal CLK. The multi-phase clock generator 220 may include a clock tree generating four-phase clock signals based on the clock signal CLK.

Due to the characteristics of a communication path between the memory controller 100 and the memory device 200 or a clock transmission path and internal distribution within the memory device 200, and offsets of various circuit blocks provided in the memory device 200, the phase of the multi-phase clock signals may not have an exact value, which may be explained by the presence of skew in the multi-phase clock signals. For example, although the phase difference between the first to fourth clock signals should sequentially correspond to 90 degrees, an error may occur in the phase difference due to the skew.

According to example embodiments, when the memory system 10 is initially driven or during a training process, an operation of detecting a skew of the multi-phase clock signals and adjusting or removing the skew may be performed. In the following example embodiments, a monitoring operation for detecting and adjusting a skew of multi-phase clock signals is described as being performed in a training process, but example embodiments are not limited thereto. The monitoring operation may be performed in various sections for setting an operating environment of the memory device 200 when the memory system 10 is initially driven or during run time of the memory system 10.

According to example embodiments, the memory device 200 may adjust a skew of multi-phase clock signals based on a duty adjustment operation and/or a skew adjustment operation using the duty adjuster 231 and the skew adjuster 232. The duty adjustment operation may perform an operation of setting a duty ratio of any one clock to 50:50, and accordingly, a logic high section and a logic low section may be equally set in any one clock. The skew adjustment operation may perform an operation of delaying or putting forward a timing of a rising edge and/or a falling edge of any one clock, and may also perform an operation of adjusting a duty ratio of a clock. Duty monitoring (DM) and duty adjustment (DA) may also be respectively referred to as duty cycle monitoring (DCM) and duty cycle adjustment (DCA).

To accurately adjust the skew of multi-phase clock signals, in example embodiments, multiple steps may be performed in a training process, and a skew for at least two phase differences may be detected through the multiple steps. For example, the memory device 200 may generate a clock signal (hereinafter referred to as a monitoring clock signal) reflecting a skew present in multi-phase clock signals by using a data pattern generated by a pattern generator 251 in the control logic 250. For example, the memory device 200 may generate a monitoring clock signal having a logic state corresponding to the data pattern at a timing of a rising edge or a falling edge of each of the multi-phase clock signals. Accordingly, when there is an error in the phase of the multi-phase clock signals due to the presence of a skew, a timing of change of a logic state in the monitoring clock signal may be affected by the skew, and accordingly, a duty ratio of the monitoring clock signal may be changed due to the skew of the multi-phase clock signals.

In example embodiments, a value of a data pattern may be changed according to multiple steps in a training process. For example, a monitoring clock signal generated based on a data pattern may have a different waveform at each step, and accordingly, the monitoring clock signal at each step may reflect a skew between different clock signals among the multi-phase clock signals.

The duty monitor 240 may monitor a duty of each of the monitoring clock signals and generate a monitoring result. For example, when a duty ratio of a monitoring clock signal does not satisfy 50:50, it may be detected that a skew exists in multi-phase clock signals, and the duty monitor 240 may generate a duty code including one or more bits as a monitoring result.

A control code ctrl code generated based on a monitoring result in a training process may be set in the memory device 200, and the control code ctrl code may include a duty control code and a skew control code. The duty adjuster 231 may be controlled by a duty control code based on a duty code, and the skew adjuster 232 may be controlled by a skew control code based on the duty code. In example embodiments, the memory controller 100 may receive a duty code from the memory device 200 and provide a duty control code and a skew control code based on the duty code to the memory device 200. In a normal operation of the memory system 10, the clock signal CLK and the multi-phase clock signals, in which a duty and/or a skew are adjusted, may be synchronized with an operation of the memory system 10. According to example embodiments, because a skew of the multi-phase clock signals may be accurately adjusted or eliminated, operational characteristics of data transmission and reception using the multi-phase clock signals may be improved.

A detailed operation example of the memory system 10 according to example embodiments described above is described below. Hereinafter, it is assumed that the multi-phase clock signals include first to fourth clock signals sequentially having a phase difference of 90 degrees.

The first clock signal and the third clock signal may have a phase difference of 180 degrees from each other, and the second clock signal and the fourth clock signal may have a phase difference of 180 degrees from each other. Also, the first clock signal and the second clock signal may have a phase difference of 90 degrees from each other, and the third clock signal and the fourth clock signal may have a phase difference of 90 degrees from each other.

In a first step of a training process, to detect whether a skew exists in the phase difference of 180 degrees between the first clock signal and the third clock signal, a first monitoring clock signal reflecting a skew between the first clock signal and the third clock signal may be generated by using a data pattern having a first value. The first monitoring clock signal may have a waveform in which a logic state transitions at an edge of the first clock signal and an edge of the third clock signal, and accordingly, may have a waveform corresponding to any one of the first clock signal and the third clock signal. The duty monitor 240 may detect a skew between the first clock signal and the third clock signal by monitoring a duty of the first monitoring clock signal.

Also, in a second step of the training process, to detect whether a skew exists in the phase difference of 180 degrees between the second clock signal and the fourth clock signal, a second monitoring clock signal reflecting a skew between the second clock signal and the fourth clock signal may be generated by using a data pattern having a second value. The duty monitor 240 may detect a skew between the second clock signal and the fourth clock signal by monitoring a duty of the second monitoring clock signal. In addition, in a third step of the training process, a third monitoring clock signal reflecting a skew between the first clock signal and the second clock signal and a skew between the third clock signal and the fourth clock signal together may be generated by using a data pattern having a third value. Accordingly, in the third step, a skew in the phase difference of 90 degrees between the first clock signal and the second clock signal and a skew in the phase difference of 90 degrees between the third clock signal and the fourth clock signal may be detected together.

According to monitoring results in the first to third steps described above, all skews present in the first clock signal to the fourth clock signal may be detected, and the skews in the first clock signal to the fourth clock signal may be adjusted by the duty adjuster 231 and the skew adjuster 232. In example embodiments, the duty adjuster 231 may adjust the skew between the first clock signal and the second clock signal and the skew between the third clock signal and the fourth clock signal together by adjusting a duty of the clock signal CLK from the memory controller 100. Also, the skew adjuster 232 may adjust a skew of at least one of the first clock signal to the fourth clock signal based on the monitoring results.

According to example embodiments, the memory device 200 may generate multi-phase clock signals by using various signals from the memory controller 100. In example embodiments, the memory device 200 may generate the multi-phase clock signals by using a write clock WCK defined in an LPDDRx specification, such as LPDDR5 or LPDDR6, or a graphics DDR (GDDR) specification, and a skew of the multi-phase clock signals may be adjusted or removed based on a duty monitoring operation through the multiple steps in example embodiments described above.

In the above example embodiments, the order of the multiple steps may be set in various ways. In example embodiments, the order of the first step and the second step may be reversed. In some example embodiments, the first step and the second step may be performed first, and then the third step may be performed.

Figure 2:
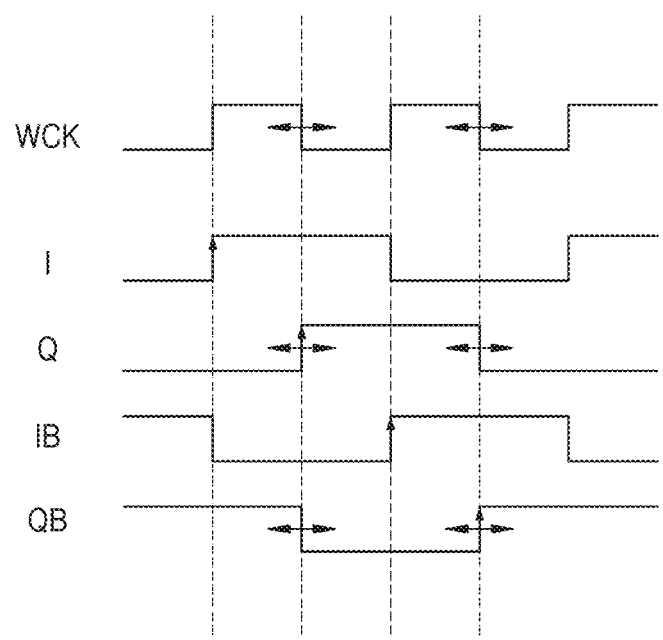
FIG. 2 is a waveform diagram illustrating an example of generating four-phase clock signals.

FIG. 2 is a waveform diagram illustrating an example of generating four-phase clock signals. FIG. 2 illustrates example embodiments in which a memory device receives a write clock WCK from a memory controller and four-phase clock signals are generated based on the write clock WCK.

The four-phase clock signals may include first to fourth clock signals I, Q, IB, and QB, and the first to fourth clock signals I, Q, IB, and QB may be generated in synchronization with rising edges and falling edges of two clocks of the write clock WCK. For example, the first clock signal I may be generated in synchronization with a rising edge of a first clock of the write clock WCK, the second clock signal Q may be generated in synchronization with a falling edge of the first clock of the write clock WCK, the third clock signal IB may be generated in synchronization with a rising edge of a second clock of the write clock WCK, and the fourth clock signal QB may be generated in synchronization with a falling edge of the second clock of the write clock WCK.

As described above, a skew may exist in the first to fourth clock signals I, Q, IB, and QB due to various factors in the memory system. When a duty of the write clock WCK is monitored, a skew for a phase difference of 90 degrees between the first clock signal I and the second clock signal Q and a skew for the phase difference of 90 degrees between the third clock signal IB and the fourth clock signal QB may be detected. However, a skew for a phase difference of 180 degrees between the first clock signal I and the third clock signal IB and a skew for the phase difference of 180 degrees between the second clock signal Q and the fourth clock signal QB may not be detected by duty monitoring of the write clock WCK.

However, according to example embodiments, multiple steps in a training process may be performed, and training may be performed through a monitoring clock signal reflecting a skew between the first clock signal I and the third clock signal IB and a monitoring clock signal reflecting a skew between the second clock signal Q and the fourth clock signal QB, and thus skews may be accurately adjusted, so that the first to fourth clock signals I, Q, IB, and QB sequentially have a phase difference of 90 degrees.

Figure 3A:
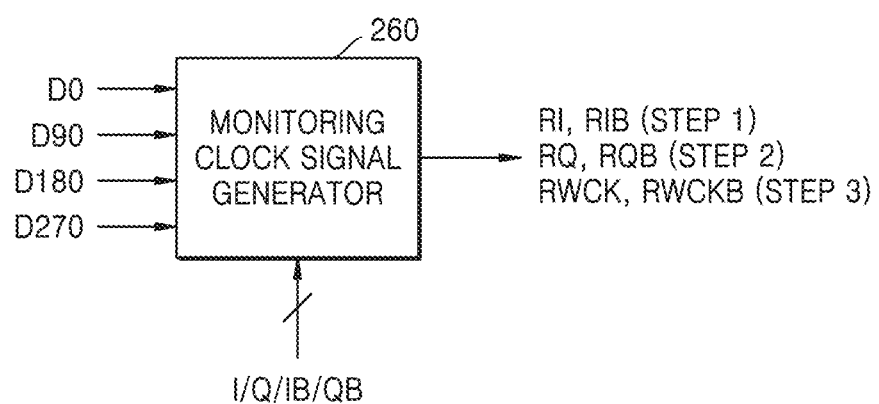

FIGS. 3A and 3B are diagrams illustrating an example of generating a data pattern according to example embodiments. FIGS. 3A and 3B illustrate example embodiments in which a monitoring clock signal is generated by using a non-flipped value (No Flip) and a flipped value (Flip) of a data pattern in each step of a training process. That is, in each step, a monitoring operation using a non-flipped value (No Flip) of a data pattern and a monitoring operation using a flipped value (Flip) of a data pattern may be performed together.

Referring to FIGS. 1 to 3A and 3B, the memory device 200 may further include a monitoring clock signal generator 260 generating a monitoring clock signal. Because the monitoring clock signal may have a waveform obtained by restoring at least one of the first to fourth clock signals I, Q, IB, and QB, or may have a waveform obtained by restoring the write clock WCK, and thus the monitoring clock signal generator 260 may also be referred to as a clock restorer. The monitoring clock signal generator 260 may receive the first to fourth clock signals I, Q, IB, and QB and 4-bit data patterns D0, D90, D180, and D270. For example, a monitoring clock signal having a logic state of value D0 at a timing of an edge (e.g., a rising edge) of the first clock signal I, a logic state of value D90 at a timing of an edge of the second clock signal Q, a logic state of value D180 at a timing of an edge of the third clock signal IB, and a logic state of value D270 at a timing of the fourth clock signal QB may be generated.

In example embodiments, in a first step (STEP 1), the non-flipped value (No Flip) of the data pattern may have "1100", and the flipped value (Flip) thereof may have "0011". A monitoring clock signal generated using the non-flipped value (No Flip) "1100" may correspond to a restored first clock signal RI obtained by restoring the first clock signal I, and a monitoring clock signal generated using the flipped value (Flip) "0011" may correspond to a restored third clock signal IB RIB obtained by restoring the third clock signal IB.

Similarly, in a second step (STEP 2), the non-flipped value (No Flip) of the data pattern may have "0110", and the flipped value (Flip) thereof may have "1001". A monitoring clock signal generated by using the non-flipped value (No Flip) "0110" may correspond to a restored second clock signal RQ obtained by restoring the second clock signal Q, and a monitoring clock signal generated using the flipped value (Flip) "1001" may correspond to a restored fourth clock signal RQB obtained by restoring the fourth clock signal QB.

Also, in a third step (STEP 3), the non-flipped value (No Flip) of the data pattern may have "1010", and the flipped value (Flip) thereof may have "0101". A monitoring clock signal generated by using the non-flipped value (No Flip) "1010" may correspond to a restored write clock RWCK obtained by restoring the write clock WCK, and a monitoring clock signal generated by using the flipped value (Flip) "0101" may correspond to an inverted-restored write clock RWCKB having an inverted state of the restored write clock RWCK.

As the logic states of the monitoring clock signals generated as above are determined in response to the edges of the first to fourth clock signals I, Q, IB, and QB, the monitoring clock signals may reflect the skew present in the first to fourth clock signals I, Q, IB, and QB. For example, because a timing at which the logic state of the monitoring clock signals transitions may correspond to the edges of the first to fourth clock signals I, Q, IB, and QB, when a skew exists in the first to fourth clock signals I, Q, IB, and QB, a duty ratio of each of the monitoring clock signals may not have a value of 50:50.

Figure 4:
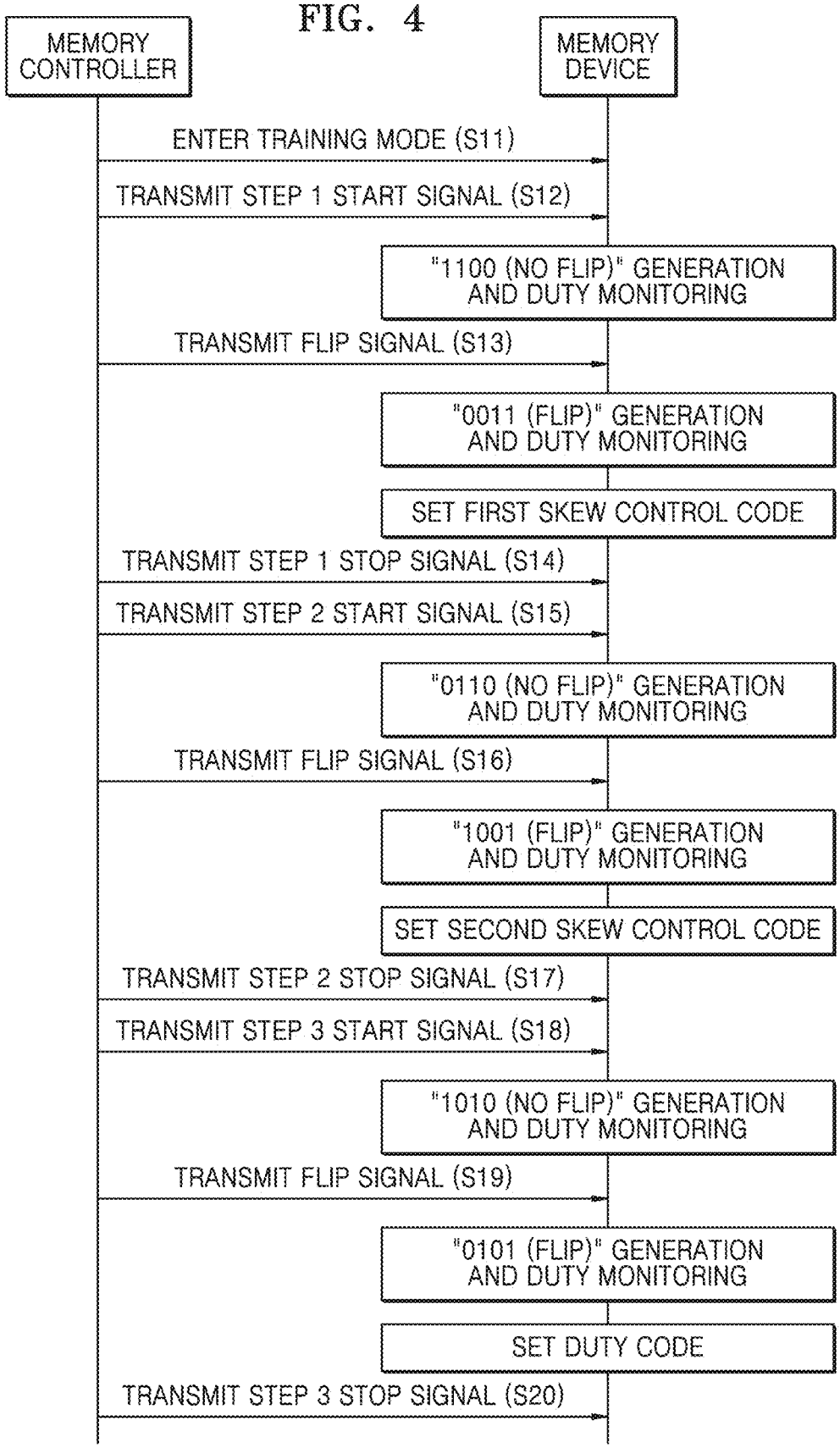
FIG. 4 is a flowchart illustrating an operating method of a memory system according to example embodiments.

FIG. 4 is a flowchart illustrating an operating method of a memory system according to example embodiments. In example embodiments shown in FIG. 4, example embodiments of adjusting the skews of the first to fourth clock signals I, Q, IB, and QB sequentially having a phase difference of 90 degrees are shown.

Referring to FIG. 4, in various example embodiments, such as the initial driving of the memory system, a memory device may enter a training mode, for example, the memory device may enter a training mode under control by a memory controller (S11). A training process may include multiple steps, and the memory controller may transmit various control signals to the memory device during the training process.

For example, the memory controller may transmit a first step start signal to the memory device (S12). The memory device may read the first step start signal to enter a first step of the training process, generate "1100" as a data pattern corresponding to a non-flipped value (No Flip) in the first step, and generate a monitoring clock signal by using "1100". Also, a monitoring result may be stored in the memory device, and the memory device may repeatedly perform monitoring operations and generation of monitoring results while changing code values for adjusting skews of the first to fourth clock signals I, Q, IB, and QB under the control by the memory controller.

Also, the memory controller may transmit a flip signal to the memory device (S13), and the memory device may generate "0011" as a data pattern corresponding to a flipped value (Flip) and generate a monitoring clock signal by using "0011". In addition, the memory device may repeatedly perform monitoring operations and generation of monitoring results while change code values for adjusting skews. Also, based on a monitoring result generated using the non-flipped value (No Flip) and the flipped value (Flip), a first skew control code for adjusting or remove a skew between the first clock signal I and the third clock signal IB may be set in the memory device.

The memory controller may transmit a first step stop signal to the memory device (S14), and then may transmit a second step start signal to the memory device (S15). The memory device may generate "0110" as a data pattern corresponding to a non-flipped value (No Flip) in a second step and generate a monitoring clock signal by using "0110". In addition, the memory device may repeatedly perform monitoring operations and generation of monitoring results while change code values for adjusting skews.

Also, the memory controller may transmit a flip signal to the memory device (S16), and the memory device may generate "1001" as a data pattern corresponding to a flipped value (Flip) and generate a monitoring clock signal by using "1001". In addition, the memory device may repeatedly perform monitoring operations and generation of monitoring results while change code values for adjusting skews. Also, based on a monitoring result generated using the non-flipped value (No Flip) and the flipped value (Flip), a second skew control code for adjusting or removing a skew between the second clock signal Q and the fourth clock signal QB may be set in the memory device.

The memory controller may transmit a second step stop signal to the memory device (S17), and then may transmit a third step start signal to the memory device (S18). The memory device may generate "1010" as a data pattern corresponding to a non-flipped value (No Flip) in a third step and generate a monitoring clock signal by using "1010". In addition, the memory device may repeatedly perform monitoring operations and generation of monitoring results while changing code values for adjusting a duty of the write clock WCK.

Also, the memory controller may transmit a flip signal to the memory device (S19), and the memory device may generate "0101" as a data pattern corresponding to a flipped value (Flip) and generate a monitoring clock signal by using "0101". In addition, the memory device may repeatedly perform monitoring operations and generation of monitoring results while changing code values for adjusting a duty of the write clock WCK. Also, based on a monitoring result generated using the non-flipped value (No Flip) and the flipped value (Flip), a duty control code for adjusting or removing a skew between the first clock signal I and the second clock signal Q and a skew between the third clock signal IB and the fourth clock signal QB may be set in the memory device. Then, the memory controller may transmit a third step stop signal to the memory device (S20).

In the above example embodiments, example embodiments where a duty monitoring operation using a non-flipped value (No Flip) is performed first in each step, but example embodiments are not limited thereto. For example, in each step, the order of the duty monitoring operation using a non-flipped value (No Flip) and the duty monitoring operation using a flipped value (Flip) may be arbitrarily set.

Figure 5:
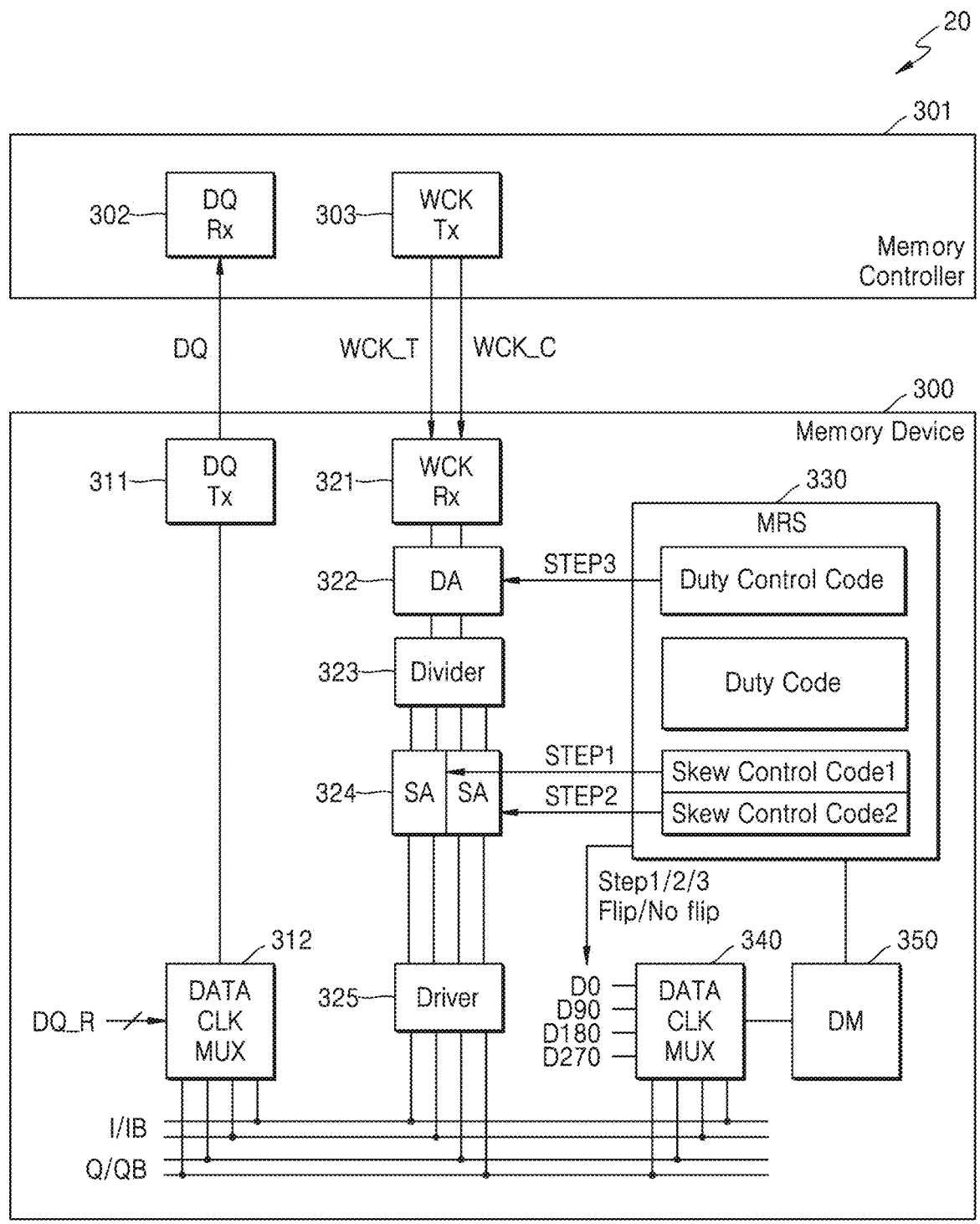
FIG. 5 is a block diagram illustrating an implementation example of a memory system according to example embodiments.

FIG. 5 is a block diagram illustrating an implementation example of a memory system according to example embodiments.

Referring to FIG. 5, a memory system 20 may include a memory controller 301 and a memory device 300. The memory device 300 may include a data transmitter 311, a first data/clock multiplexer 312, a write clock receiver 321, a duty adjuster 322, a divider 323, a skew adjuster 324, a driver 325, a mode register set 330, a second data/clock multiplexer 340, and a duty monitor 350. Some of the components shown in FIG. 5 may configure a multi-phase clock generator in the above-described example embodiments, or may configure a pattern generator or clock restorer.

The memory controller 301 may include a data receiver 302 ad a write clock WCK transmitter 303, and the data transmitter 311 may provide data DQ to the memory controller 301 through a data channel. Also, the write clock receiver 321 may receive the write clock WCK. For example, the write clock WCK may include differential signals WCK_T and WCK_C.

According to example embodiments, the duty adjuster 322 may adjust a duty (or a duty cycle) of the write clock WCK. For example, monitoring results at multiple steps in a training process may be stored in the mode register set 330 as a duty code, and a duty control code based on a monitoring result may be set in the mode register set 330. In example embodiments, the memory controller 301 may receive the duty code stored in the mode register set 330, and a duty control code is provided to the memory device 300 based on the duty code, and thus the duty control code may be stored in the mode register set 330. The duty adjuster 322 may adjust the duty of the write clock WCK according to the duty control code.

The divider 323 may correspond to or be included in the multi-phase clock signal generator in example embodiments described above, and may generate multi-phase clock signals by using the write clock WCK. For example, the divider 323 may generate the first to fourth clock signals I, Q, IB, and QB sequentially having a phase difference of 90 degrees by using the write clock WCK.

The skew adjuster 324 may adjust skews of the first to fourth clock signals I, Q, IB, and QB. In example embodiments, the skew adjuster 324 may adjust the skews of the first to fourth clock signals I, Q, IB, and QB based on a skew control code set based on monitoring results in multiple steps in a training process. The skew adjuster 324 may include at least one skew adjustment circuit. For example, the skew adjuster 324 may include a first skew adjustment circuit adjusting a skew of at least one of the first and third clock signals I and IB and a second skew adjustment circuit adjusting a skew of at least one of the second and fourth clock signals Q and QB. Similar to the duty control of the write clock WCK described above, a duty code according to a monitoring result may be provided to the memory controller 301, and the memory controller 301 may provide first and second skew control codes 1 and 2 for controlling the first and second skew adjustment circuits to the memory device 300.

The driver 325 may drive and output the first to fourth clock signals I, Q, IB, and QB of which the skews are adjusted, and may, for example, output the first to fourth clock signals I, Q, IB, and QB to wires transmitting various clock signals. The first data/clock multiplexer 312 may receive write read data DQ_R together with the first to fourth clock signals I, Q, IB, and QB, and may provide the read data DQ_R to the data transmitter 311 in synchronization with the first to fourth clock signals I, Q, IB, and QB.

According to example embodiments, the second data/clock multiplexer 340 may receive the first to fourth clock signals I, Q, IB, and QB and data patterns D0, D90, D180, and D270 in a training process, and may generate a monitoring clock signal according to example embodiments described above. The second data/clock multiplexer 340 may correspond or be included in the monitoring clock signal generator in example embodiments described above. In example embodiments, the second data/clock multiplexer 340 may receive the data patterns D0, D90, D180, and D270 having different values in multiple steps in a training process, and may output monitoring clock signals having different waveforms according to the values of the data patterns D0, D90, D180, and D270.

The duty monitor 350 may monitor a duty of a monitoring clock signal from the second data/clock multiplexer 340, and may output a duty code according to a monitoring result. The mode register set 330 may store various types of information used in a training process, and various control operations for duty/skew adjustment in multiple steps of the training process may be performed by using information stored in the mode register set 330. In example embodiments, the mode register set 330 may be defined as including a pattern generator for generating the data patterns D0, D90, D180, and D270. Alternatively, A pattern generator as a circuit block provided outside the mode register set 330 may be defined as generating the data patterns D0, D90, D180, and D270 using information stored in the mode register set 330.

According to example embodiments, a training process may include first to third steps STEP 1 to STEP 3, and in each of the first to third steps STEP 1 to STEP 3, a non-flipped value (No Flip) and a flipped value (Flip) of a data pattern may be provided to the second data/clock multiplexer 340. In the first step STEP 1, the duty monitor 350 may provide a result of detecting a skew between the first clock signal I and the third clock signal IB as a monitoring result, and the first skew control code 1 for adjusting a skew of at least one of the first clock signal I and the third clock signal IB may be set in the mode register set 330. Also, in the second step STEP 2, the duty monitor 350 may provide a result of detecting a skew between the second clock signal Q and the fourth clock signal QB as a monitoring result, and the second skew control code 2 for adjusting a skew of at least one of the second clock signal Q and the fourth clock signal QB may be set in the mode register set 330. In addition, in the third step STEP 3, the duty monitor 350 may provide a result of detecting a skew between the first clock signal I and the second clock signal Q and a skew between the third clock signal IB and the fourth clock signal QB as a monitoring result, and a duty control code for adjusting the duty of the write clock WCK may be set in the mode register set 330.

During a training process of the memory device 300, an operation of generating a monitoring clock signal and an operation of monitoring a duty may be repeatedly performed while changing a code value for adjusting a duty and a code value for adjusting a skew. Through the above repeated processes, a duty control code and a skew control code, which are able to reduce or minimize the skews of the first to fourth clock signals I, Q, IB, and QB, may be determined in the training process and stored in the mode register set 330.

In the above example embodiments, although the first data/clock multiplexer 312 and the second data/clock multiplexer 340 are shown as separate components, example embodiments are not limited thereto. For example, the first data/clock multiplexer 312 may perform a function of outputting the read data DQ_R as being arranged in a read pass. As the first data/clock multiplexer 312 receives a data pattern in the training process described above, the memory device 300 may be implemented so that the first data/clock multiplexer 312 functions as a monitoring clock signal generator.

Figure 6:
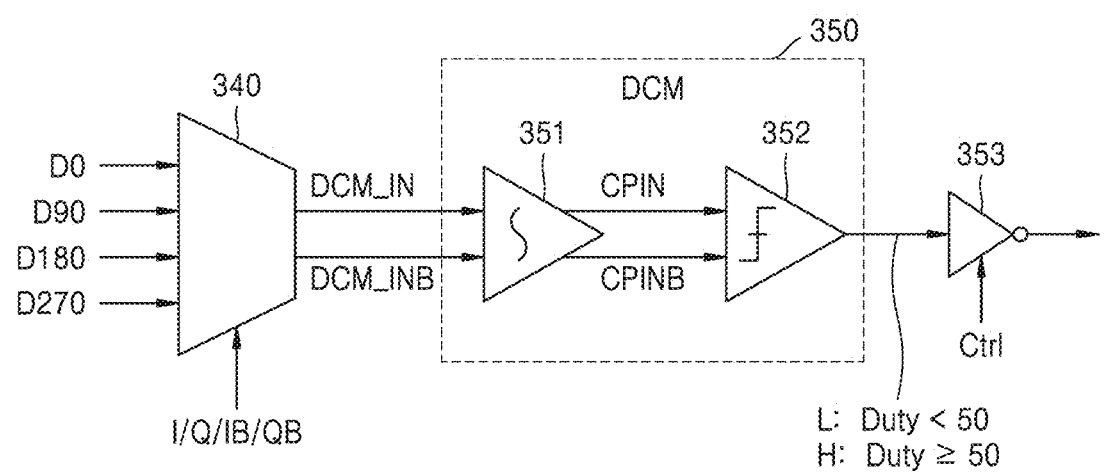
FIG. 6 is a block diagram illustrating an implementation example of a duty monitor.

FIG. 6 is a block diagram illustrating an implementation example of the duty monitor 350.

Referring to FIGS. 5 and 6, the memory device 300 may include the second data/clock multiplexer 340 and the duty monitor 350, and the duty monitor 350 may include an integrator 351 and a comparator 352. In addition, in example embodiments, the memory device 300 may further include an inverter 353, and the inverter 353 may selectively perform an inverting operation in response a control signal ctrl.

The second data/clock multiplexer 340 may generate a monitoring clock signal reflecting the skews of the first to fourth clock signals I, Q, IB, and QB, and for example, the monitoring clock signal may include differential signals DCM_IN and DCM_INB. The integrator 351 may perform an integration operation on the differential signals DCM_IN and DCM_INB, and the comparator 352 may generate a monitoring result having a logic state according to a duty ratio of a monitoring clock signal by comparing integral signals CPIN and CPINB. For example, when a duty ratio of a monitoring clock signal is less than 50 (when a logic low section is longer), a monitoring result having a first value (e.g., logic low (L)) may be generated. On the contrary, when the duty ratio of the monitoring clock signal is 50 or more (when a logic high section is longer), a monitoring result having a second value (e.g., logic high (H)) may be generated.

During the training process of the memory device 300, at least one of an output signal of the comparator 352 and an output signal of the inverter 353 may be used as a monitoring result. In example embodiments, in each step of the training process, when at least one of the output signal of the comparator 352 and the output signal of the inverter 353 is used as a monitoring result in generating a data pattern having a non-flipped value (No Flip), another one of the output signal of the comparator 352 and the output signal of the inverter 353 may be used as a monitoring result in generating a data pattern having a flipped value (Flip).

In the following, particular examples of a monitoring operation according to example embodiments are described. FIGS. 7A, 7B, 7C, 7D, 7E to 12A and 12B are diagrams illustrating waveforms and monitoring results of the first to fourth clock signals I, Q, IB, and QB in a training process.

FIGS. 7A, 7B, 7C, 7D, 7E to 20 show an operation example of a first step in the training process. FIGS. 7A, 7B, 7C, 7D, 7E and 8 show operation examples in example embodiments where a skew does not exist in multi-phase clock signals, and FIGS. 9A, 9B, 9C, 9D, and 10 show operation examples in example embodiments where a skew exists in the multi-phase clock signals. In addition, in the examples of FIGS. 7A, 7B, 7C, 7D, 7E to 10, example embodiments in which an offset (e.g., an offset of a duty monitor) exists in a memory system are described.

As shown in FIGS. 7A, 7B, 7C, 7D, and 7E, in the first step, a duty monitoring operation may be performed while adjusting a skew of at least one of the first clock signal I and the third clock signal IB. For example, example embodiments in which the skew of the third clock signal IB is adjusted by changing a value of a skew adjustment code SA code are shown. When a duty monitoring operation using the skew adjustment code SA code of any one value is completed, the duty monitoring operation using the skew adjustment code SA of a different value may be performed under control by the memory controller. In addition, the skew adjustment code SA code may be defined as a certain range, and the duty monitoring operation may be repeatedly performed while changing the skew adjustment code SA code from a minimum value to a maximum value.

Terms according to example embodiments may be defined in various ways. For example, among various values of the skew adjustment code SA code, a code having an optimal (or improved) value for skew adjustment may be set as the first skew control code 1 in example embodiments shown in FIG. 5. Alternatively, the skew adjustment code SA code may be defined as the same or substantially the same concept as a skew control code. In some example embodiments, it may be explained that a duty monitoring operation is performed while changing the skew control code, and any one skew control code corresponds to the first skew control code 1 in example embodiments shown in FIG. 5.

Figure 7A:
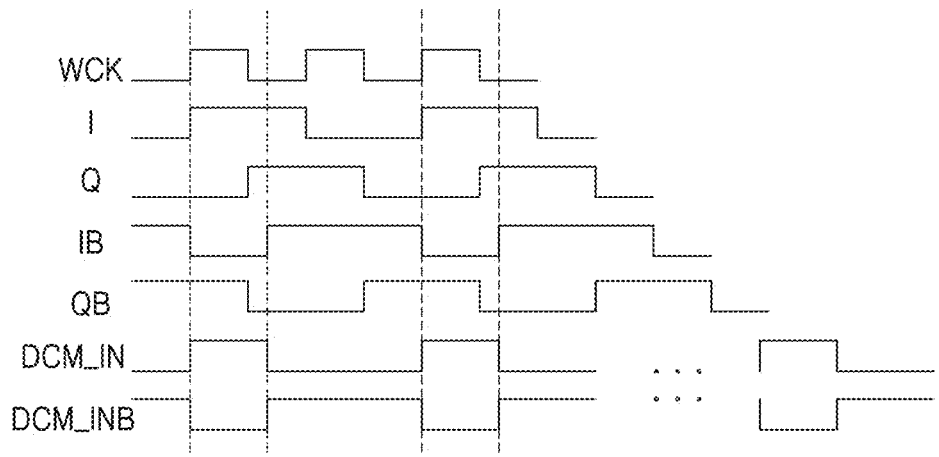
Figure 7A:
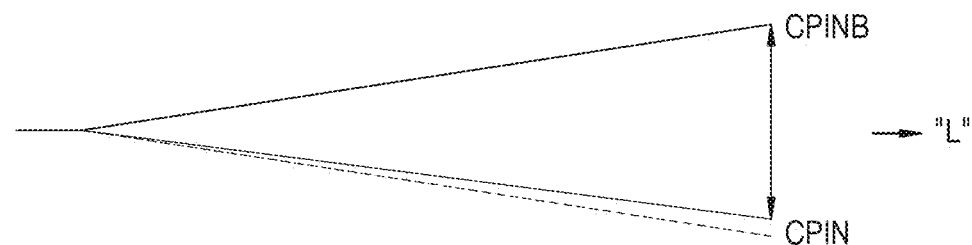
Figure 7A:
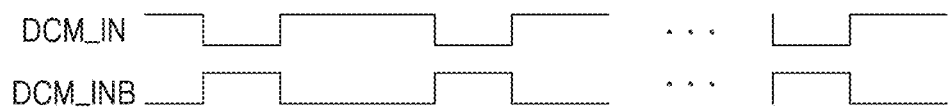
Figure 7A:
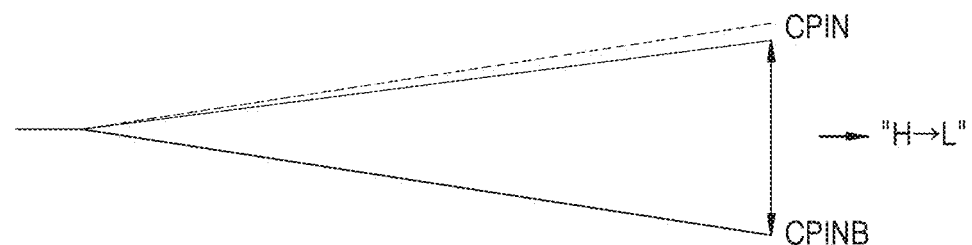
Figure 7B:
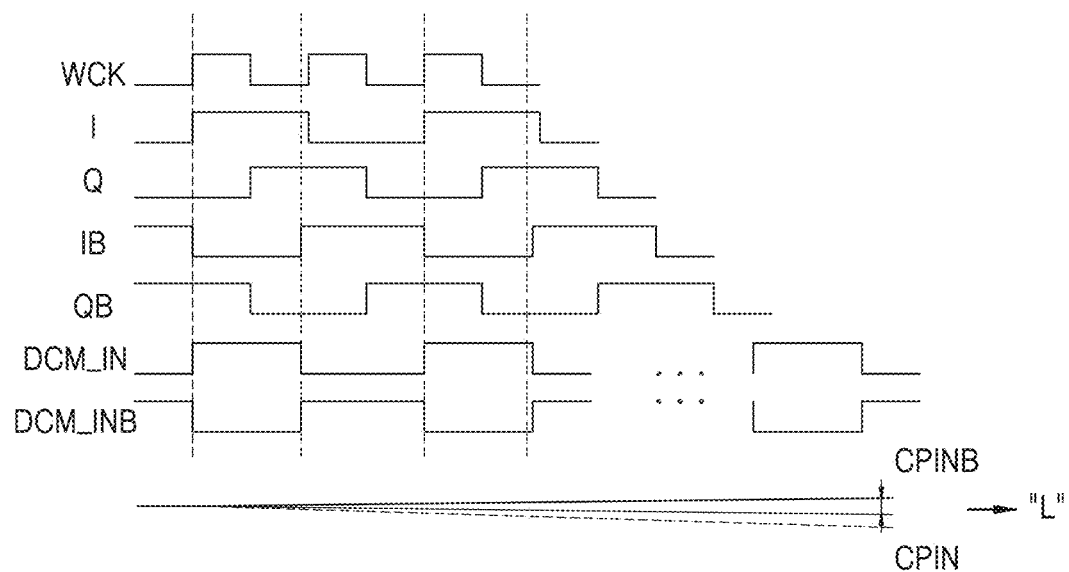
Figure 7B:
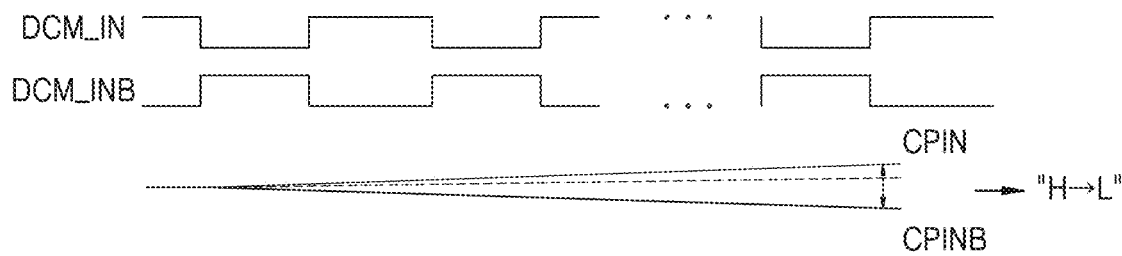
Figure 7C:
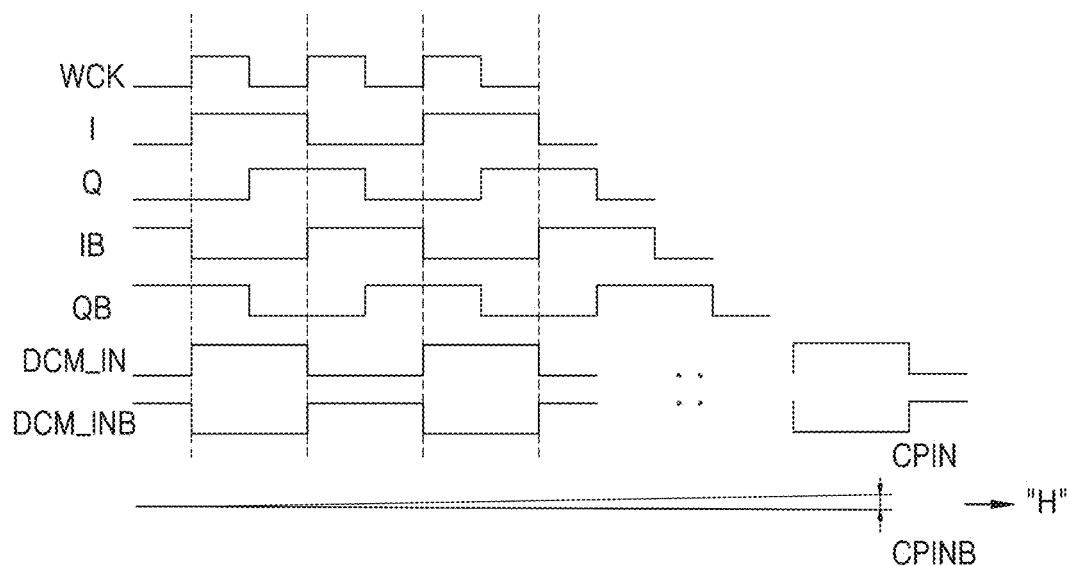
Figure 7C:
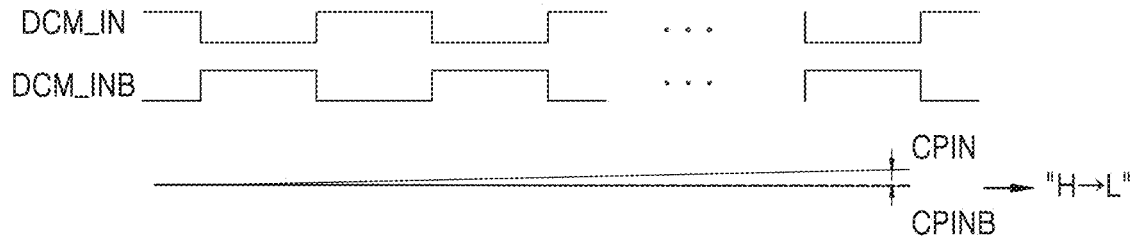

The duty monitoring operation may be performed while changing the value of the skew adjustment code SA code from a minimum value (e.g., −7) to a maximum value (e.g., +7). When the skew adjustment code SA code has a value of −7, the third clock signal IB may transition to logic high at a fast timing, and the waveforms of monitoring clock signals DCM_IN and DCM_INB generated by a data pattern of "1100" as a non-flipped value (No Flip) may have a relatively long logic low section as shown in FIG. 7A. In some example embodiments, a level of a signal CPINB corresponding to an inverted integral signal may be greater than that of an integral signal CPIN, and the duty monitoring result may have a first value (e.g., logic low). In the signals CPIN and CPINB shown in FIG. 7A, the levels thereof shown by dotted lines represent a level of the signal CPIN in example embodiments where no offset exists. An example in which the level of the signal CPIN is increased as the offset exists by the code value of 1 in the (+) direction compared to example embodiments where the offset does not exist is shown.

Thereafter, the duty monitoring operation may be performed with the skew adjustment code SA code in an increased state, and even when the skew adjustment code SA code has a value of −1, the level of the signal CPINB is greater than that of the signal CPIN. Accordingly, the duty monitoring result may have a logic low value. On the contrary, the level of the signal CPIN may have a value greater than or equal to the level of the signal CPINB from a time point when the skew adjustment code SA code has a value of 0, and example embodiments in which the level of the signal CPIN is greater than the level of the signal CPINB by a code value of 1 due to the above offset is shown. Accordingly, the duty monitoring result may have a second value (e.g., logic high). Also, even when the skew adjustment code SA code has a value of +1 or +7, the duty monitoring result may have a logic high value.

In example embodiments, an operation of monitoring a duty by using the monitoring clock signals DCM_IN and DCM_INB generated by a data pattern of "0011" as a flipped value (Flip) may be further performed. In example embodiments, when a data pattern of a flipped value (Flip) is used, the ca value obtained by inverting an output of the comparator 352 in FIG. 6 may be provided as a monitoring result.

The monitoring clock signals DCM_IN and DCM_INB generated by the data pattern of the flipped value (Flip) may have an inverted logic state compared to example embodiments where the data pattern of the non-flipped value (No Flip) is used. When the skew adjustment code SA code has a value of −7, the waveforms of the monitoring clock signals DCM_IN and DCM_INB may have the waveforms shown in FIG. 7A. In some example embodiments, the level of the signal CPIN may be greater than that of the signal CPINB, and a duty monitoring result corresponding to a value obtained by inverting the output of the comparator 352 may have a logic low value. Similarly, even when the skew control code SA code has a value of −1 and a value of 0, the duty monitoring result may have a logic low value.

Figure 7D:
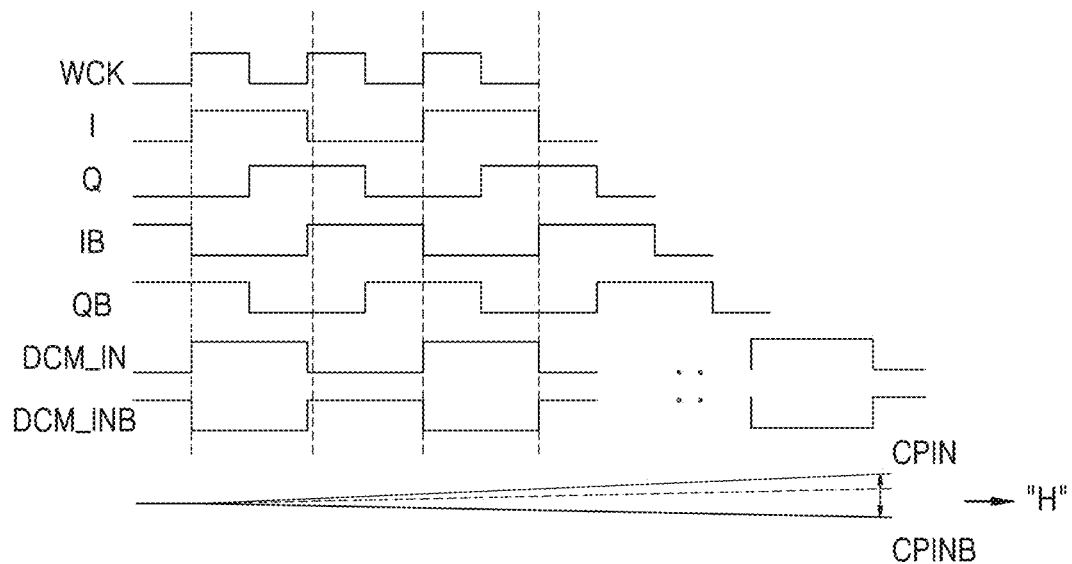
Figure 7D:
Figure 7D:
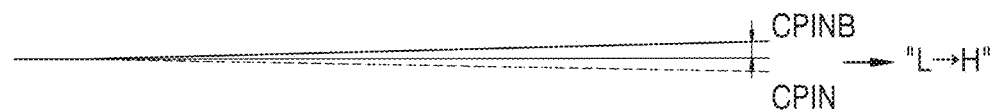
Figure 7E:
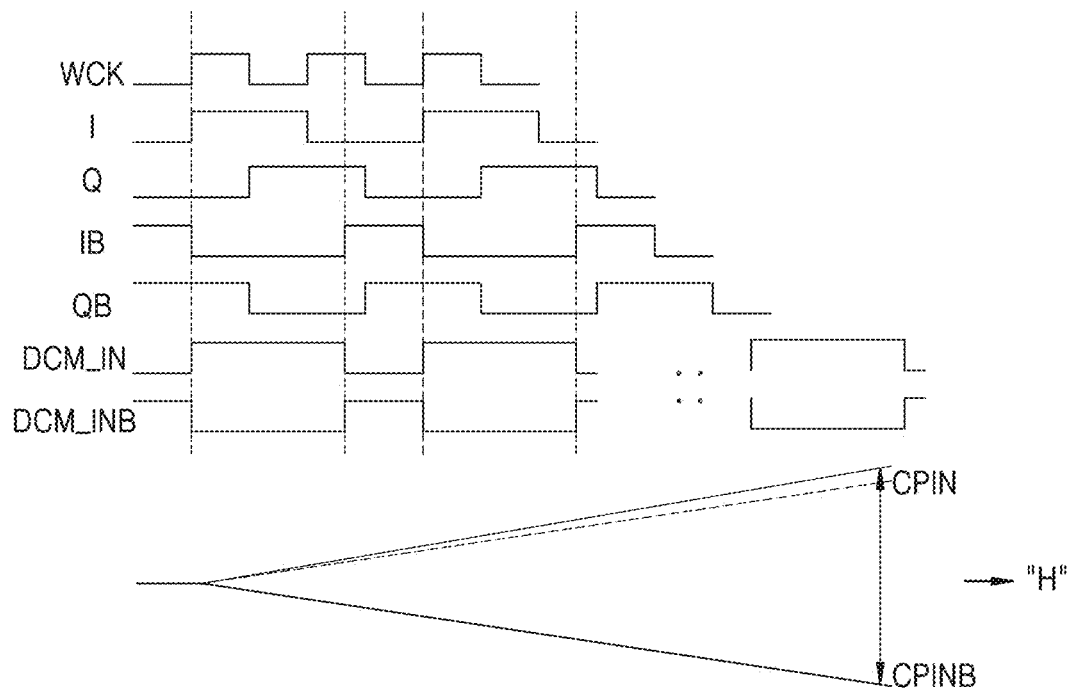
Figure 7E:
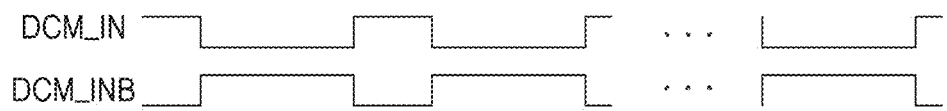
Figure 7E:
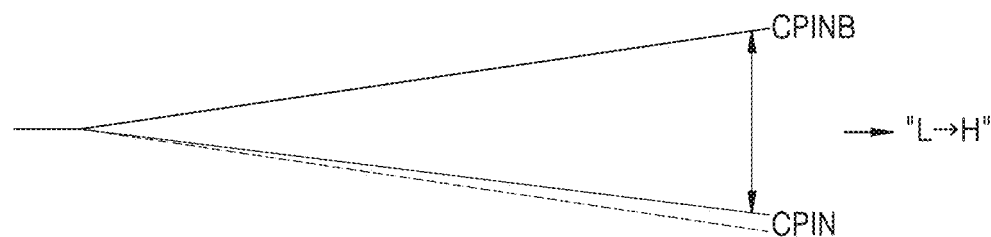

On the contrary, as shown in FIG. 7D, the level of the signal CPINB may become greater than the level of the signal CPIN from a time point when the skew adjustment code SA code has a value of +1, and accordingly, the duty monitoring result may have a logic high value. Also, when the skew adjustment code SA code has a value of +7, the duty monitoring result may have a logic high value.

FIG. 8 shows a result of the duty monitoring operation in FIGS. 7A, 7B, 7C, 7D, and 7E described above, and a monitoring result in example embodiments of using a data pattern of a non-flipped value (No Flip) and a data pattern of a flipped value (Flip) is shown. For example, a monitoring result generated while changing the skew adjustment code SA code from −7 to +7 may be stored in a mode register set. FIG. 8 corresponds to a monitoring result in example embodiments where there is no skew between the first clock signal I and the third clock signal IB, and a first skew control code for adjusting the skew between the first clock signal I and the third clock signal IB may be determined to be 0.

Figure 9A:
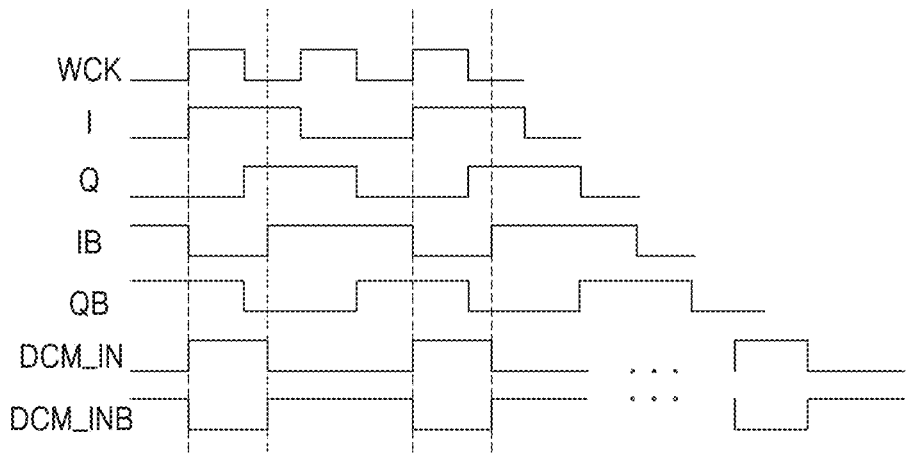
Figure 9A:
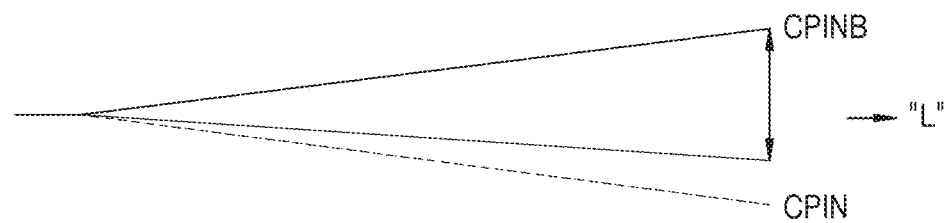
Figure 9A:
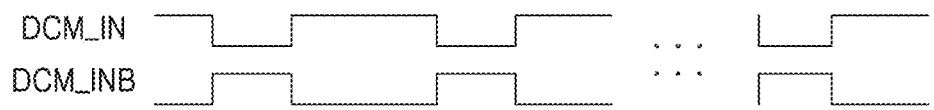
Figure 9A:
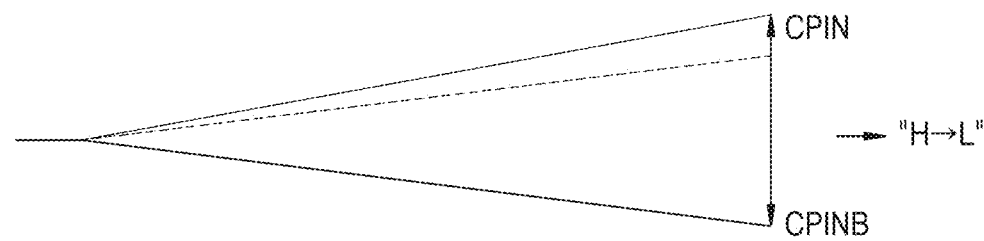
Figure 9B:
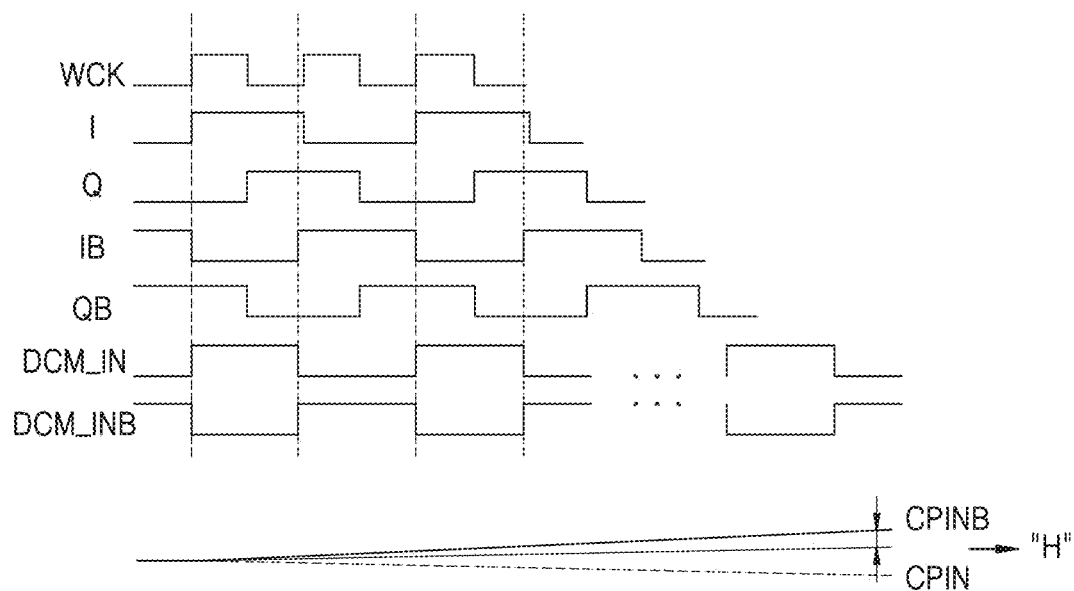
Figure 9B:
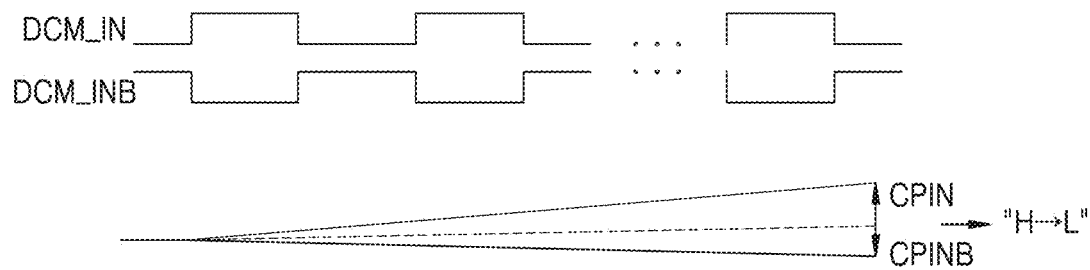
Figure 9C:
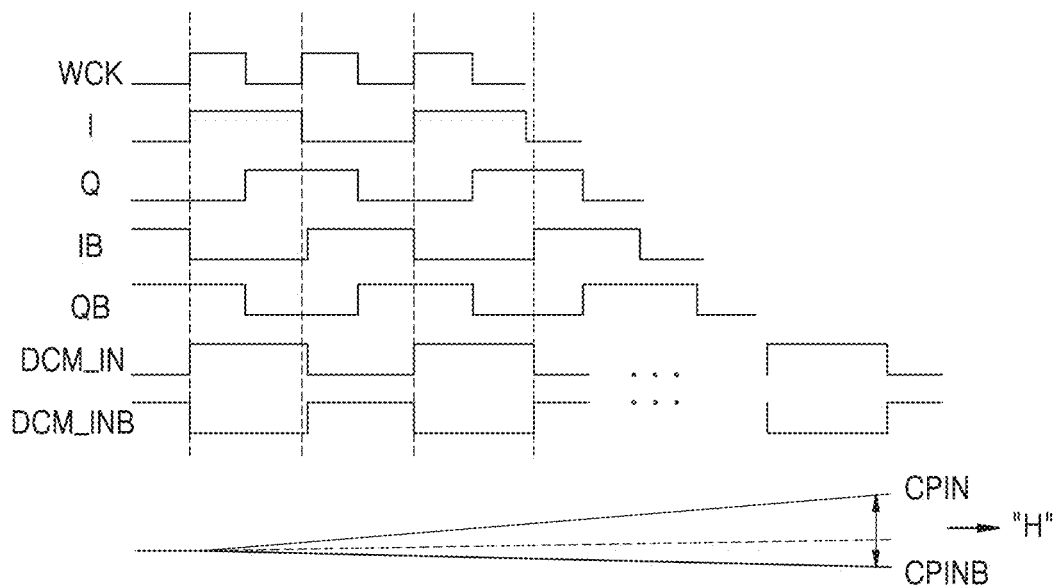
Figure 9C:
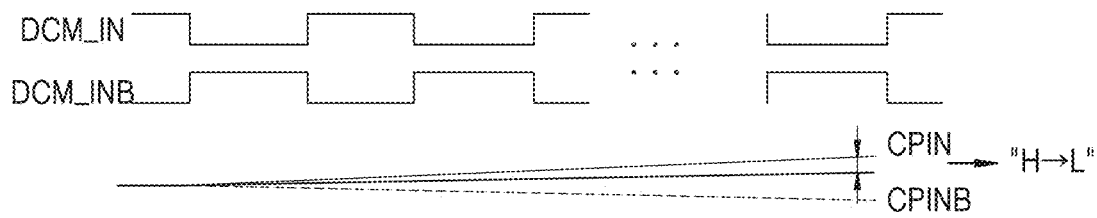
Figure 9D:
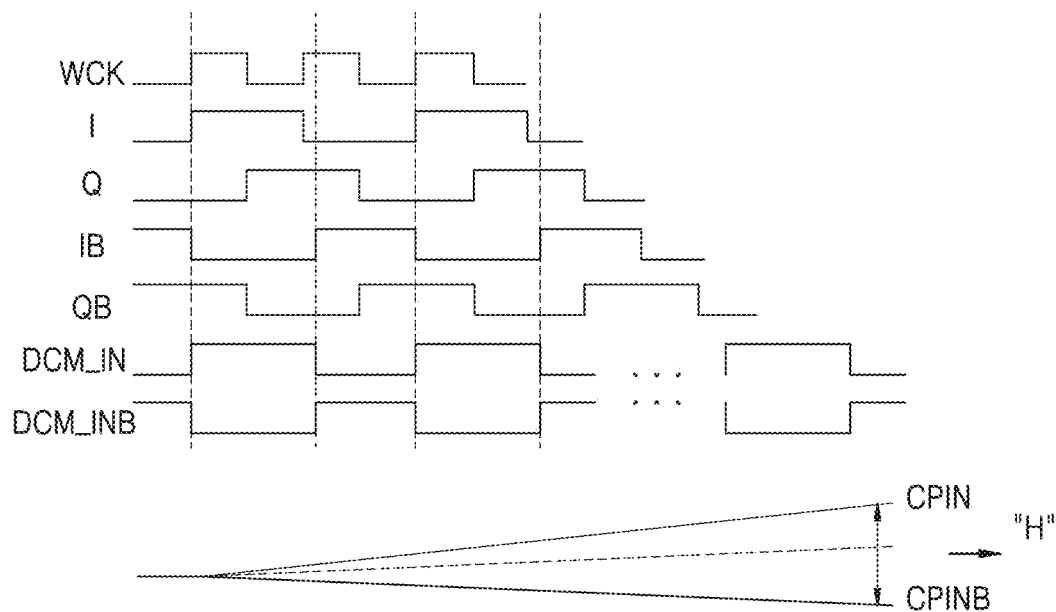
Figure 9D:
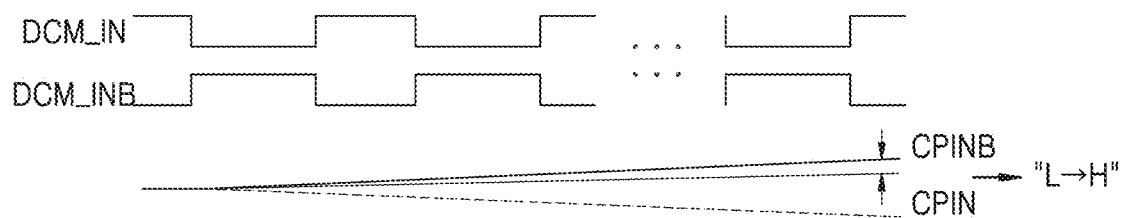

In FIGS. 9A, 9B, 9C, 9D, and 10, example embodiments in which a skew between the first clock signal I and the third clock signal IB exits by a code value of 1 in a (+) direction are shown, and example embodiments where the level of the signal CPIN is increased as an offset exists by a code value of 3 in the (+) direction compared with example embodiments where an offset does not exist (a level shown by a dotted line) are also shown. For example, when the skew adjustment code SA code has a value of −7, the waveforms of the monitoring clock signals DCM_IN and DCM_INB generated by a data pattern of "1100" as a non-flipped value (No Flip) may have a relatively long logic low section as shown in FIG. 9A. In some example embodiments, the level of the signal CPINB corresponding to an inverted integral signal may be greater than the level of the integral signal CPIN, and the duty monitoring result may have a logic low value.

Thereafter, a duty monitoring operation may be performed while increasing the skew adjustment code SA code, and the level of the signal CPIN may be greater than the level of the signal CPINB from a time point when the skew adjustment code SA code has a value of −2, and accordingly, the duty monitoring result may have a logic high value.

According to a result of monitoring the duty of the monitoring clock signals DCM_IN and DCM_INB generated by a data pattern of "0011" as a flipped value (Flip), the duty monitoring result may have a logic low value until the skew adjustment code SA code has a value of 0. On the contrary, the duty monitoring result may have a logic high value from a time point when the skew adjustment code SA code has a value of +1.

FIG. 10 shows a result of the duty monitoring operation in FIGS. 9A, 9B, 9C, and 9D described above, and a monitoring result in example embodiments of using a data pattern of a non-flipped value (No Flip) and a data pattern of a flipped value (Flip) is shown. A monitoring result when the skew adjustment code SA code shown in FIG. 10 has a value from −2 to 0 is due to an offset, and in an example shown in FIG. 10, the first skew control code for adjusting a skew between the first clock signal I and the third clock signal IB may be determined to be −1. As described above, in example embodiments, as a training process using both a non-flipped value (No Flip) and a flipped value (Flip) is performed, a skew due to an offset present within the memory system may be canceled out along with adjusting skews between the multi-phase clock signals.

Hereinafter, example embodiments in which a second step and a third step of the training process are performed by using a data pattern of a non-flipped value (No Flip) and a data pattern of a flipped value (Flip). In the description of the following example embodiments, examples of particular waveforms of the first to fourth clock signals I, Q, IB, and QB and a monitoring clock signal are omitted.

In example embodiments, in the second step, a skew of at least one of the second clock signal Q and the fourth clock signal QB may be adjusted according to variation of the skew adjustment code SA code, and the second skew control code 2 in example embodiments shown in FIG. 5 may be determined through the second step. In the third step, a duty of the write clock WCK may be adjusted according to variation of a duty adjustment code DA code, and a duty control code in example embodiments shown in FIG. 5 may be determined through the third step.

FIGS. 11A and 11B show a result of the duty monitoring operation in the second step, and a monitoring result in example embodiments of using a data pattern of a non-flipped value (No Flip) and a data pattern of a flipped value (Flip) is shown. FIG. 11A corresponds to a monitoring result in example embodiments where there is no skew between the second clock signal Q and the fourth clock signal QB, and an offset exists by a code value of 1 in the (+) direction, and according to the monitoring result, the second skew control code for adjusting the skew between the second clock signal Q and the fourth clock signal QB may be determined to be 0.

FIG. 11B shows example embodiments in which a skew between the second clock signal Q and the fourth clock signal QB exists by a code value of 2 in a (−) direction, and an offset also exists by a code value of 5 in the (+) direction. For example, due to the skew and the offset, when a data pattern of a non-flipped value (No Flip) is used, a monitoring result may have a logic high value from a time point when the value of the skew adjustment code SA code corresponds to 0. On the contrary, when a data pattern of a flipped value (Flip) is used, a monitoring result may have a logic high value from a time point when the skew adjustment code SA code corresponds to 5. A monitoring result when the skew adjustment code SA code shown in FIG. 11 has a value from 0 to +4 is due to an offset, and in an example shown in FIG. 11B, the second skew control code for adjusting a skew between the second clock signal Q and the fourth clock signal QB may be determined to be +2.

FIGS. 12A and 12B show a result of the duty monitoring operation in the third step, and a monitoring result in example embodiments of using a data pattern of a non-flipped value (No Flip) and a data pattern of a flipped value (Flip) is shown. A result of the duty monitoring operation in the third step may be used as information for adjusting the duty of the write clock WCK, and accordingly, the duty monitoring operation may be performed while changing a value of the duty adjustment code DA code adjusting the duty of the write clock WCK. FIG. 12A corresponds to a monitoring result in example embodiments where a skew between the first clock signal I and the second clock signal Q does not exits, a skew between the third clock signal IB and the fourth clock signal QB does not exist, and an offset also exists by a code value of 1 in the (+) direction. At this time, the duty control code may be determined to be 0 according to the monitoring result.

FIG. 12B shows example embodiments in which a skew between the first clock signal I and the second clock signal Q (or between the third clock signal IB and the fourth clock signal QB) exists by a code value of 1 in the (−) direction.

Also, a monitoring result shown in FIG. 12B may correspond to a result when an offset exits by a code value of 1 in the (+) direction, and in the example shown in FIG. 12B, the duty control code may be determined to be +1.

When the first step to the third step are completed, first/second skew control codes and a duty control code corresponding to an optimal (or improved) skew adjustment code SA code and an optimal (or improved) duty adjustment code DA code obtained in the training process may be set in a mode register set, and accordingly, skews between the multi-phase clock signals may be removed.

Figure 13:
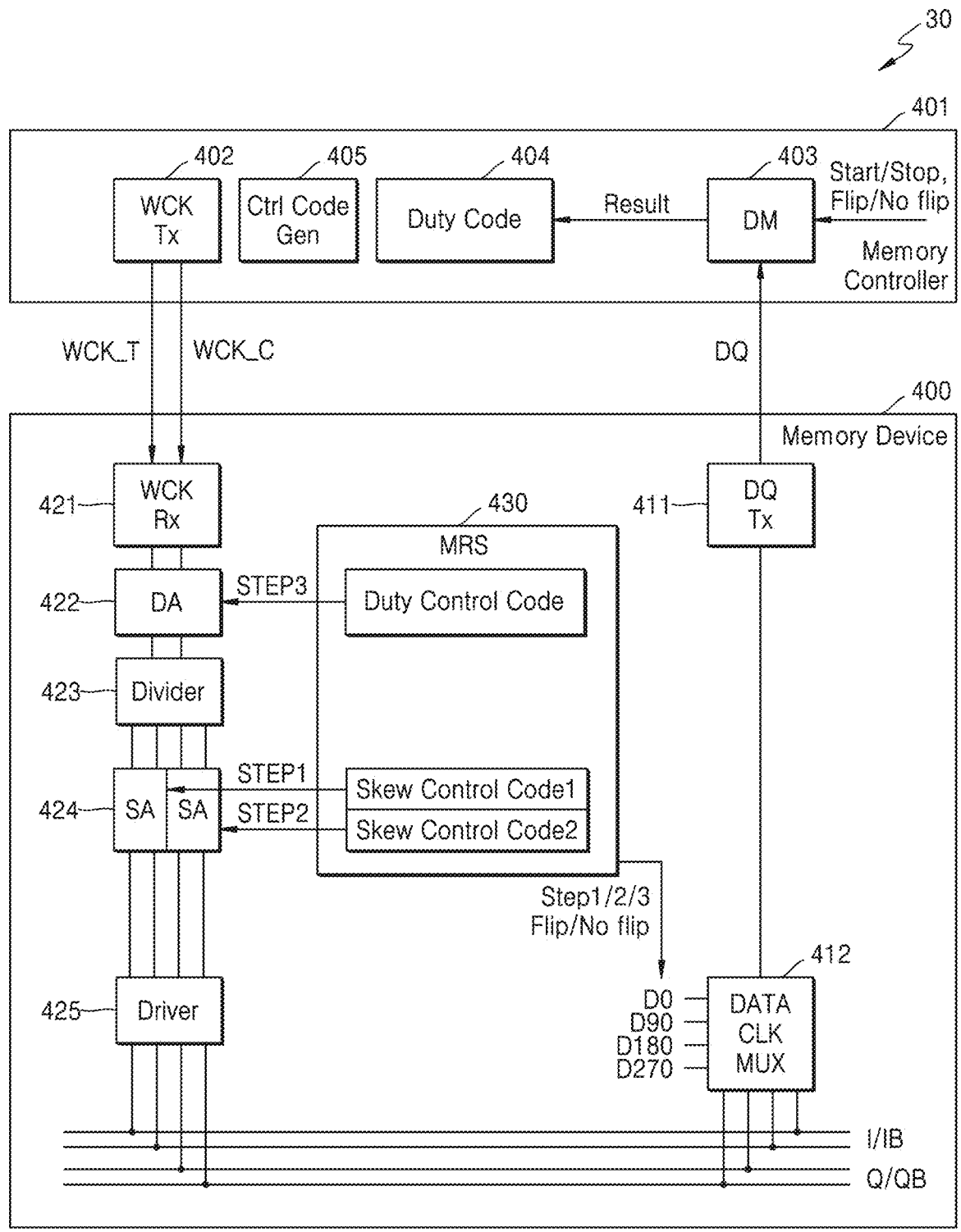
FIG. 13 is a block diagram of a memory system according to example embodiments.

FIG. 13 is a block diagram illustrating a memory system according to various example embodiments. In a memory system 30 of FIG. 13, example embodiments in which a duty monitoring operation according to example embodiments is performed in a memory controller are shown.

Referring to FIG. 13, the memory system 30 may include a memory controller 401 and a memory device 400. The memory controller 401 may include a write clock WCK transmitter 402, a duty monitor 403, a duty code storage circuit 404, and a control code generator 405. The write clock WCK transmitter 402 may transmit the write clock WCK to the memory device 400. For example, the write clock WCK may include differential signals WCK_T and WCK_C.

The memory device 400 may include a data transmitter 411, a data/clock multiplexer 412, a write clock receiver 421, a duty adjuster 422, a divider 423, a skew adjuster 424, a driver 425, and a mode register set 430. Some of the components shown in FIG. 13 may configure a multi-phase clock generator in the above-described example embodiments, or may configure a pattern generator or clock restorer.

The memory device 400 may receive the write clock WCK, and the duty adjuster 422 may adjust the duty of the write clock WCK by using a duty control code. The divider 423 may generate multi-phase clock signals based on a dividing operation for the write clock WCK having an adjusted duty, and may generate, for example, the first to fourth clock signals I, Q, IB, and QB. Also, the first to fourth clock signals I, Q, IB, and QB may be provided to the skew adjuster 424, and the skew adjuster 424 may include at least one skew adjustment circuit. For example, the skew adjuster 424 may include a first skew adjustment circuit adjusting a skew of at least one of the first and third clock signals I and IB and a second skew adjustment circuit adjusting a skew of at least one of the second and fourth clock signals Q and QB. The driver 425 may drive and output the first to fourth clock signals I, Q, IB, and QB having an adjusted skew, and the first to fourth clock signals I, Q, IB, and QB may be provided to the data/clock multiplexer 412.

In a training process, the data/clock multiplexer 412 may receive the first to fourth clock signals I, Q, IB, and QB and the data patterns D0, D90, D180, and D270, and may generate monitoring clock signals having different waveforms for multiple steps according to the above example embodiments. The monitoring clock signals may reflect the skews of the first to fourth clock signals I, Q, IB, and QB. Also, according to example embodiments, the data patterns D0, D90, D180, and D270 may each have a non-flipped value (No Flip) and a flipped value (Flip), and monitoring clock signals corresponding to each of the non-flipped value (No Flip) and the flipped value (Flip) may be generated.

In the training process, the monitoring clock signals generated by the data/clock multiplexer 412 may be provided to the memory controller 401 through the data transmitter 411 and a data DQ channel. The duty monitor 403 of the memory controller 401 may perform a duty monitoring operation in multiple steps by using the monitoring clock signals provided from the memory device 400. For example, the memory controller 401 may include a processor (not shown) performing overall control of the training process, and based on the control by the processor, information (Start/Stop) indicating an start and an end of each step and information (Flip/No Flip) for distinguishing a non-flipped value/flipped value may be provided to the duty monitor 403. The duty monitor 403 may provide a duty code to the duty code storage circuit 404 as a monitoring result in each of the multiple steps described above.

The duty monitor 403 may perform a duty monitoring operation in each step based on the information (Start/Stop, Flip/No Flip), and for example, the duty code storage circuit 404 may store the duty monitoring result as shown in FIG. 8. The control code generator 405 may generate the duty control code determined in the training process and the first and second skew control codes 1 and 2 based on control by the processor and provide the same to the memory device 400. During a normal operation, the memory device 400 may adjust or remove the skews of the first to fourth clock signals I, Q, IB, and QB by performing duty adjustment/skew adjustment according to the duty control code and the first and second skew control codes 1 and 2.

Although not illustrated in FIG. 13, the memory controller 401 or the memory device 400 may include a phase splitter (not shown) to generate a monitoring clock signal having a differential signal form. For example, outputs of the phase splitter may correspond to the differential signals DCM_IN and DCM_INB shown in FIG. 6.

Also, although not illustrated in FIG. 13, a monitoring clock signal may be provided to the memory controller 401 through a pin transmitting a data strobe signal (DQS/DQSB). In some example embodiments, the memory device 400 may provide a monitoring clock signal in a differential signal form to the memory controller 401 without using the phase splitter.

Figure 14:
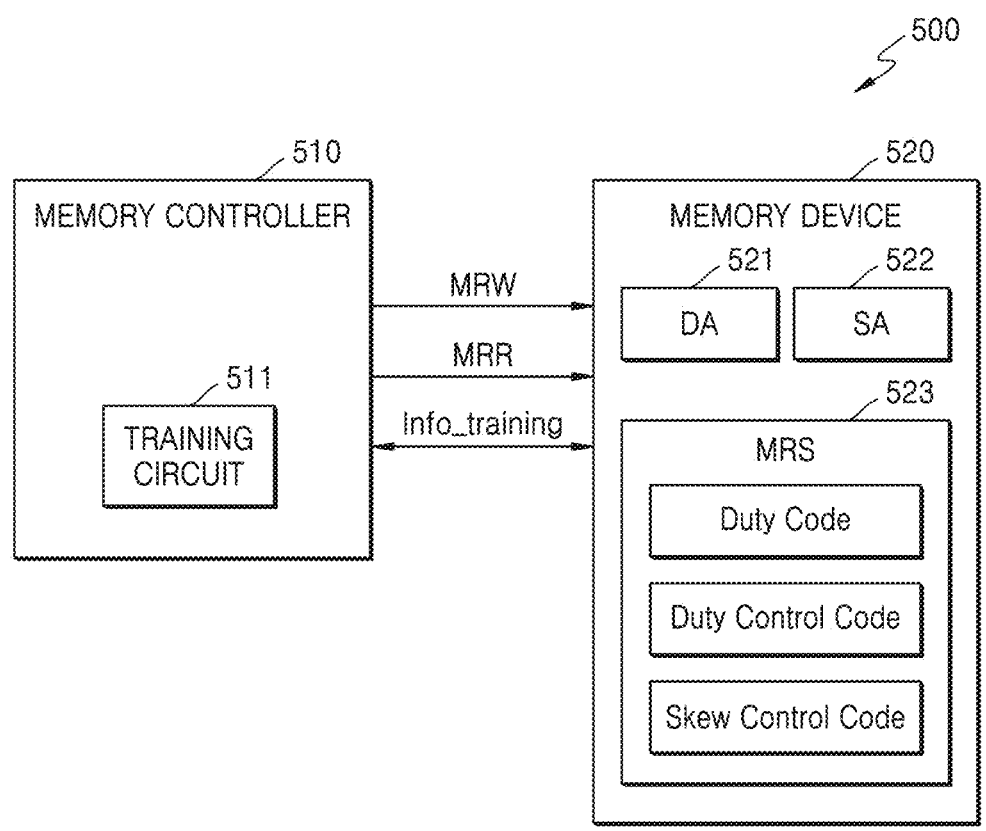
FIG. 14 is a block diagram illustrating an operation example of setting a mode register set, according to example embodiments.

FIG. 14 is a block diagram illustrating an operation example of setting a mode register set, according to example embodiments.

Referring to FIG. 14, a memory system 500 may include a memory controller 510 and a memory device 520, and the memory controller 510 may include a training circuit 511. Also, the memory device 520 may include a duty adjuster 521, a skew adjuster 522, and a mode register set 523. As the mode register set 523 includes a plurality of registers, monitoring results generated in multiple steps of the training process may be stored.

During the training process, information related to training Info_training stored in the mode register set 523 may be accessed under control by the memory controller 510. The memory controller 510 may access the mode register set 523 of the memory device 520 through various pins, such as a data pin, a command/address pin, or the like. For example, the mode register set 523 may be accessed through pins defined in LPDDRx specifications, such as LPDDR4, LPDDR5, and LPDDR6, and MRS pins. As an operation example, aa duty code may be provided to the memory controller 510 by a mode register read command MRR as a monitoring result. In addition, the memory controller 510 may generate the duty control code and the skew control code, and the duty control code and the skew control code may be stored in the mode register set 523 by a mode register write command MRW.

Figure 15:
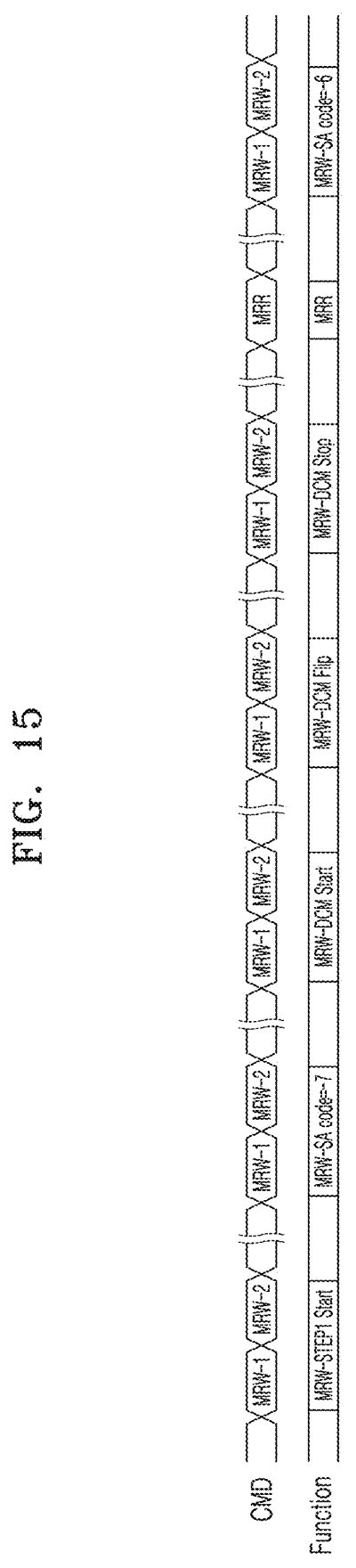
Figure 16:
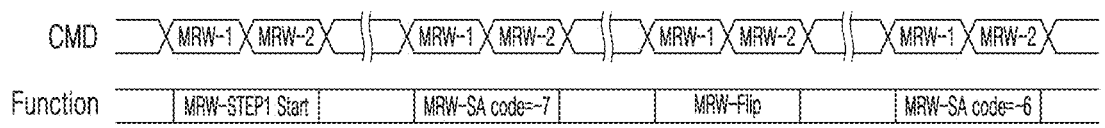

FIGS. 15 and 16 are diagrams illustrating examples of signals transmitted and received between a memory controller and a memory device. FIGS. 15 and 16 show signals transmitted and received in relation to mode register setting, wherein FIG. 15 shows an example of a signal in example embodiments where a duty monitor is included in the memory device, and FIG. 16 shows an example of a signal when the duty monitor is included in the memory controller. As described above, the memory controller and the memory device may transmit and receive MRS commands and various types of information related to training through various types of pins, such as a data pin, a command/address pin, and an MRS pin.

Referring to FIG. 15, during the training process, the memory controller may transmit MRW commands MRW-1 and MRW-2 to the memory device, and the MRW command may be a command instructing the start of the first step. Then, the memory controller may transmit an MRW command for setting a skew adjustment code to a certain value (e.g., −7 as a minimum value), and may also transmit an MRW command indicating the start of duty monitoring. In addition, according to example embodiments described above, for duty monitoring using a non-flipped value (No Flip) and a flipped value (Flip), the memory controller may transmit an MRW command indicating the flipped value (Flip). Also, when duty monitoring using the non-flipped value (No Flip) and the flipped value (Flip) is completed, an MRW commands indicating an end of duty monitoring may be transmitted.

When the duty monitoring as described above ends, the memory controller may transmit an MRR command for receiving a duty monitoring result according to a skew adjustment code having a certain value to the memory device. Then, to perform a duty monitoring operation using a skew adjustment code having a different value, the memory controller may transmit an MRW command for setting the skew adjustment code to another value (e.g., −6).

As the memory controller performs the duty monitoring operation according to example embodiments, a signal transmitted to and received from the memory device in the training process may follow the waveform shown in FIG. 16. For example, the memory controller may transmit the MRW commands MRW-1 and MRW-2 to the memory device, and the MRW command may be a command instructing the start of the first step. Also, the memory controller may transmit an MRW command for setting the skew adjustment code to a certain value (e.g., −7 as a minimum value), and the memory device may transmit a monitoring clock signal generated using a data pattern of the non-flipped value (No Flip) defined in the first step to the memory controller.

Then, the memory controller may transmit an MRW command indicating the flipped value (Flip). The memory device may transmit a monitoring clock signal generated using a data pattern of the flipped value (Flip) defined in the first step to the memory controller. The memory controller may store a duty monitoring result using the non-flipped value (No Flip) and the flipped value (Flip). Then, to perform a duty monitoring operation using a skew adjustment code having a different value, the memory controller may transmit an MRW command for setting the skew adjustment code to another value (e.g., −6). The memory device may generate multi-phase clock signals based on the skew adjustment code of which the value is changed, and may transmit a monitoring clock signal generated based thereon to the memory controller.

Figure 17A:
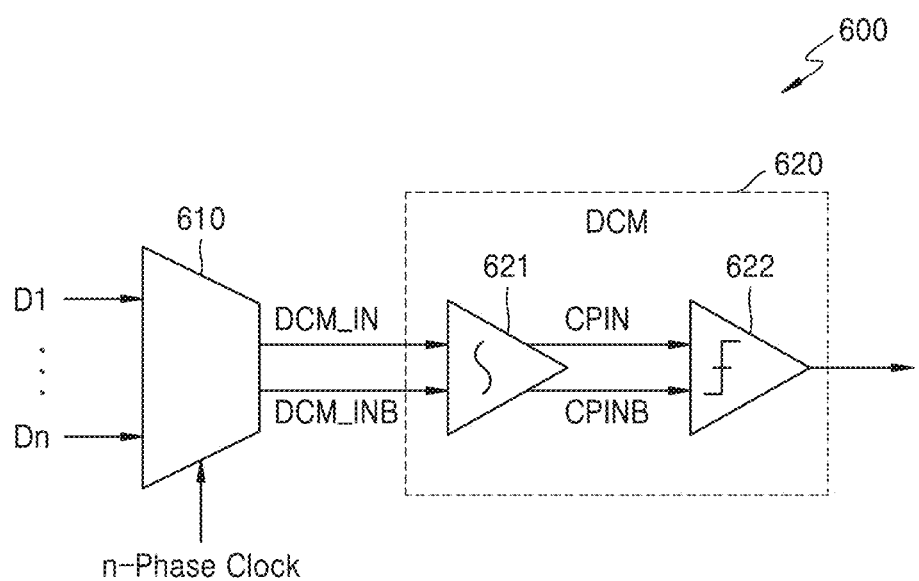
Figure 17B:
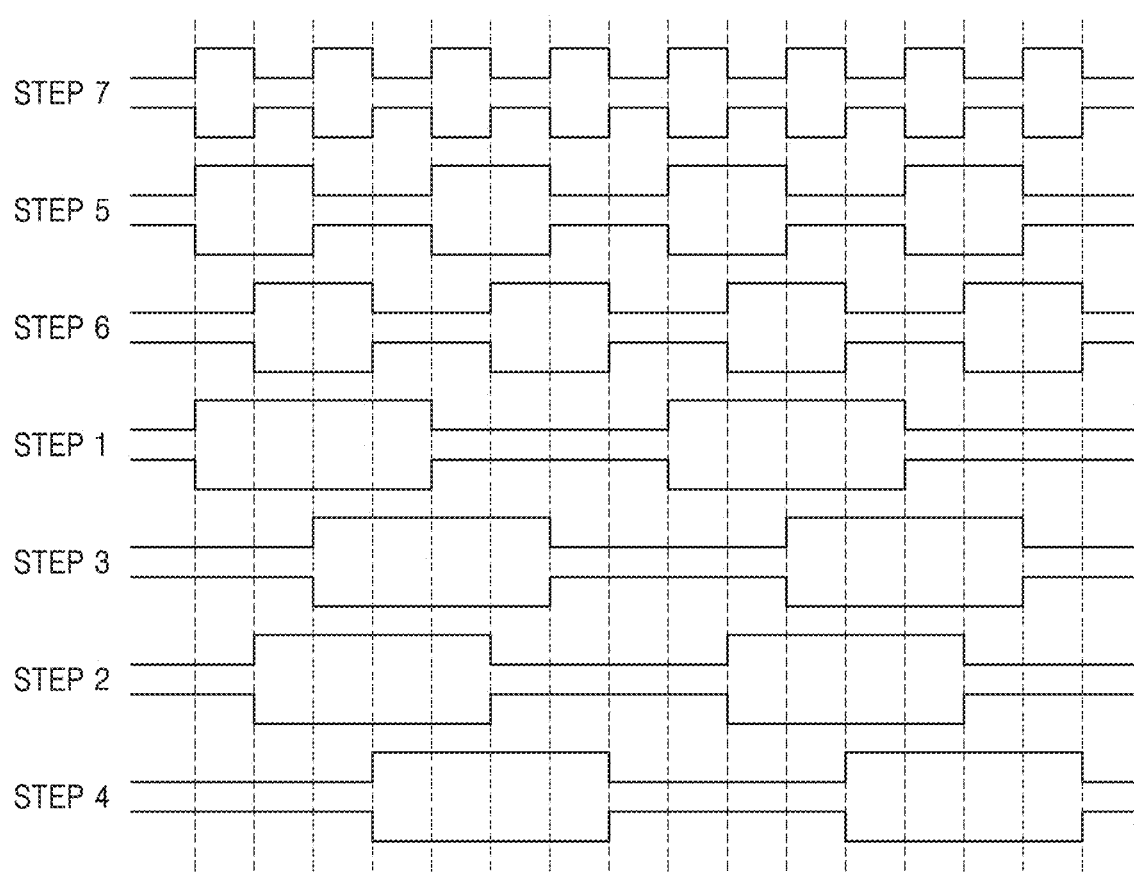

FIGS. 17A, 17B, and 18 are diagrams illustrating a concept of a training operation according to other example embodiments. In a memory device, more than four n multi-phase clock signals may be generated, and in the example of FIGS. 17A, 17B, and 18, example embodiments in which eight multi-phase clock signals (first to eighth clock signals) are generated are shown.

Referring to FIG. 17A, a memory device 600 may include a data/clock multiplexer 610 and a duty monitor 620, and the duty monitor 620 may include an integrator 621 and a comparator 622. Although not illustrated in FIG. 17A, the memory device 600 may further include an inverter (not shown) for inverting an output of the comparator 622.

During a training process, the data/clock multiplexer 610 may receive n-phase clock signals and a data pattern including n bits. A monitoring clock signal of which a logic state varies according to a data pattern may be generated at an edge of each of the n-phase clock signals, an integration operation is performed on the monitoring clock signal including the differential signals DCM_IN and DCM_INB, and a monitoring result may be generated by using integral signals CPIN and CPINB.

Referring to FIG. 17B, to adjust skews of first to eighth clock signals having different phases generated from a clock signal or a write clock, a training process including first to seventh steps may be performed. FIG. 17B illustrates monitoring clock signals generated in the first to seventh steps, wherein, in the first to fourth steps, a skew between clock signals having a phase difference of 360 degrees with respect to a clock signal among the first to eighth clock signals may be detected, and in the fifth and sixth steps, a skew between clock signals having a phase difference of 180 degrees may be detected. Also, in the seventh step, a skew between clock signals having a phase difference of 90 degrees may be detected.

FIG. 18 shows an example of a data pattern generated in example embodiments shown in FIGS. 17A and 17B. As shown in FIG. 18, a data pattern of a non-flipped value (No Flip) and a data pattern of a flipped value (Flip) may be generated. For example, in the first step, the data pattern of the non-flipped value (No Flip) may have a value of "11110000", and the data pattern of the flipped value (Flip) may have a value of "00001111". Also, in the seventh step, the data pattern of the non-flipped value (No Flip) may have a value of "10101010", and the data pattern of the flipped value (Flip) may have a value of "01010101".

Also, in example embodiments, monitoring results generated by multiple steps may be used for duty adjustment and skew adjustment operations. For example, the memory device 600 may include a duty adjuster adjusting a duty of a clock signal or a write clock from the memory controller, and a skew adjuster adjusting the skews of multi-phase clock signals, and the skew adjuster may include a plurality of skew adjustment circuits. In example embodiments, monitoring results of the first to sixth steps may be used to determine a skew control code for controlling the plurality of skew adjustment circuits. Also, a monitoring result of the seventh step may be used to determine a duty control code for controlling the duty adjuster adjusting a duty of a clock signal or a write clock.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although configurations in the above example embodiments have been described as being applied to a memory device and a memory controller, example embodiments are not limited thereto. For example, example embodiments may be applied to correct or remove skews of multi-phase clock signals for various types of semiconductor devices generating the multi-phase clock signals and performing signal processing using the multi-phase clock signals.

While the inventive concepts have been particularly shown and described with reference to example embodiments thereof, it will be understood that various changes in form and details may be made therein without departing from the spirit and scope of the following claims.

What is claimed is:

1. A memory device comprising:
a memory cell array comprising a plurality of memory cells;
a multi-phase clock generator configured to generate first to N-th clock signals having N different phases, based on a clock signal provided from a memory controller (wherein N is an integer of 3 or more);
a monitoring clock signal generator configured to receive a data pattern in a training operation and generate a monitoring clock signal having a logic state corresponding to the data pattern in synchronization with edges of the first to N-th clock signals, wherein the monitoring clock signal reflects skews of the first to N-th clock signals;
a duty adjuster configured to adjust a duty of the clock signal from the memory controller based on a duty control code set in the training operation;
a skew adjuster configured to adjust a skew of at least one of the first to N-th clock signals based on a skew control code set in the training operation; and
a control logic configured to control the training operation of detecting the skews between the first to N-th clock signals,
wherein the monitoring clock signal comprises a first monitoring clock signal configured to detect a skew between the first clock signal and the third clock signal in a first step of the training operation, a second monitoring clock signal configured to detect a skew between the second clock signal and the fourth clock signal in a second step of the training operation, and a third monitoring clock signal configured to detect a skew between the first clock signal and the second clock signal in a third step of the training operation.

2. The memory device of claim 1, further comprising:
a duty detector configured to receive the monitoring clock signal and generate a duty code comprising at least one bit indicating a result of detecting a duty of the monitoring clock signal; and
a mode register set configured to store the duty code.

3. The memory device of claim 2, wherein the duty code is provided to the memory controller in the training operation, and
the duty control code and the skew control code provided from the memory controller are stored in the mode register set in the training operation.

4. The memory device of claim 3, wherein the duty adjuster is configured to adjust the skew between the first clock signal and the second clock signal by adjusting the duty of the clock signal in response to the duty control code, and
the skew adjuster comprises a first skew adjustment circuit configured to adjust a skew of the first clock signal and/or the second clock signal in response to the skew control code, and a second skew adjustment circuit configured to adjust a skew of the second clock signal and/or the fourth clock signal in response to the skew control code.

5. The memory device of claim 1, wherein the control logic comprises a pattern generator configured to generate a data pattern having different values in the first to third steps.

6. The memory device of claim 1, wherein the first to N-th clock signals correspond to four-phase clock signals and comprises first to fourth clock signals sequentially having a phase difference of 90 degrees, and
the data pattern comprises four bits corresponding to edges of the first to fourth clock signals.

7. The memory device of claim 6, wherein the first monitoring clock signal is generated by a data pattern having a value of "1100" or "0011" in the first step,
the second monitoring clock signal is generated by a data pattern having a value of "0110" or "1001" in the second step, and
the third monitoring clock signal is generated by a data pattern having a value of "1010" or "0101" in the third step.

8. The memory device of claim 7, wherein, in the first step, duty monitoring operations using the first monitoring clock signal generated by using the value of "1100" corresponding to a non-flipped (No Flip) data pattern and the first monitoring clock signal generated by using the value of "0011" corresponding to a flipped (Flip) data pattern are performed together.

9. The memory device of claim 7, wherein, in the second step, duty monitoring operations using the second monitoring clock signal generated by using the value of "0110" corresponding to a non-flipped (No Flip) data pattern and the second monitoring clock signal generated by using the value of "1001" corresponding to a flipped (Flip) data pattern are performed together.

10. The memory device of claim 7, wherein, in the third step, duty monitoring operations using the third monitoring clock signal generated by using the value of "1010" corresponding to a non-flipped (No flip) data pattern and the third monitoring clock signal generated by using the value of "0101" corresponding to a flipped (Flip) data pattern are performed together.

11. The memory device of claim 6, wherein a skew for a phase difference of 180 degrees between the first clock signal and the third clock signal is corrected in the first step,
a skew for the phase difference of 180 degrees between the second clock signal and the fourth clock signal is corrected in the second step, and
a skew for a phase difference of 90 degrees between the first clock signal and the second clock signal and a skew for a phase difference of 90 degrees between the third clock signal and the fourth clock signal are corrected by adjusting the duty of the clock signal in the third step.

12. The memory device of claim 1, wherein the control logic, in each of the first to third steps, is configured to adjust the skews of the first to N-th clock signals caused by an offset in the memory device by performing duty monitoring using a non-flipped (No Flip) data pattern and a flipped (Flip) data pattern together.

13. A memory controller configured to control a training operation of a memory device, the memory controller comprising:

a clock signal transmitter configured to transmit a clock signal used to generate first to N-th clock signals having N different phases by the memory device (wherein N is an integer of 3 or more);

a duty detector which, in the training operation, is configured to receive a monitoring clock signal having a logic state corresponding to a certain data pattern at edge timings of the first to N-th clock signals from the memory device and generate a duty code comprising at least one bit indicating a result of detecting a duty of the monitoring clock signal;

a control code generator configured to generate a duty control code and a skew control code configured to control a duty adjuster and a skew adjuster provided in the memory device, respectively, based on the duty code generated in the training operation; and a processor configured to control the training operation comprising multiple steps with respect to the memory device, wherein the monitoring clock signal has a waveform reflecting skews of the first to N-th clock signals, the skew control code comprises information configured to adjust a skew of at least one of the first to N-th clock signals to adjust skews between signals having a phase difference of a first value among the first to N-th clock signals, and the duty control code comprises information configured to adjust the duty of the clock signal to adjust skews between signals having a phase difference of a second value among the first to N-th clock signals.

14. The memory controller of claim 13, wherein the clock signal comprises a write clock (WCK) in a low power double data rate (LPDDR) specification.

15. The memory controller of claim 13, wherein the first to N-th clock signals correspond to four-phase clock signals and comprise first to fourth clock signals sequentially having a phase difference of 90 degrees, and the data pattern comprises four bits corresponding to edges of the first to fourth clock signals.

16. The memory controller of claim 15, wherein the training operation comprises first to third steps, the monitoring clock signal is generated by a data pattern having a value of "1100" or "0011" in the first step, the monitoring clock signal is generated by a data pattern having a value of "0110" or "1001" in the second step, and the monitoring clock signal is generated by a data pattern having a value of "1010" or "0101" in the third step.

17. The memory controller of claim 16, wherein the skew control code comprises a first skew control code configured to adjust a skew of a phase difference of 180 degrees between the first clock signal and the third clock signal, and a second skew control code configured to adjust a skew of the phase difference of 180 degrees between the second clock signal and the fourth clock signal, the duty control code is configured to adjust a skew of a phase difference of 90 degrees between the first clock signal and the second clock signal and a skew of the phase difference of 90 degrees between the third clock signal and the fourth clock signal, and the skew control code is generated based on monitoring results in the first step and the second step, and the duty control code is generated based on a monitoring result of the third step.

18. An operating method of a memory device, the operating method comprising:

generating first to fourth clock signals sequentially having a phase difference of 90 degrees, based on a clock signal provided from a memory controller;

generating a monitoring clock signal in which a logic state transitions according to a data pattern generated in the memory device at edge timings of the first to fourth clock signals during a training operation; and generating a duty code comprising information indicating skews between the first to fourth clock signals, based on a duty monitoring result with respect to the monitoring clock signal, during the training operation, wherein the training operation comprises:

a first step of adjusting a skew between the first clock signal and the third clock signal by performing a duty monitoring operation using the monitoring clock signal generated to correspond to a waveform of the first clock signal by using a non-flipped (No Flip) data pattern and a duty monitoring operation using the monitoring clock signal generated to correspond to a waveform of the third clock signal by using a flipped (Flip) data pattern together;

a second step of adjusting a skew between the second clock signal and the fourth clock signal by performing a duty monitoring operation using the monitoring clock signal generated to correspond to a waveform of the second clock signal by using the non-flipped (No Flip) data pattern and a duty monitoring operation using the monitoring clock signal generated to correspond to a waveform of the fourth clock signal by using the flipped (Flip) data pattern together; and a third step of adjusting a skew between the first clock signal and the second clock signal and a skew between the third clock signal and the fourth clock signal by performing a duty monitoring operation using the monitoring clock signal generated to correspond to a clock signal from the memory controller by using the non-flipped (No Flip) data pattern and a duty monitoring operation using the monitoring clock signal generated to correspond to an inverted waveform of the clock signal from the memory controller by using the flipped (Flip) data pattern together.

19. The operating method of claim 18, wherein, in the first step, the non-flipped (No Flip) data pattern corresponds to "1100", and the flipped (Flip) data pattern corresponds to "0011", in the second step, the non-flipped (No Flip) data pattern corresponds to "0110", and the flipped (Flip) data pattern corresponds to "1001", and, in the third step, the non-flipped (No Flip) data pattern corresponds to "1010", and the flipped (Flip) data pattern corresponds to "0101".

20. The operating method of claim 18, further comprising:

transmitting the duty code generated in each of the first to third steps to the memory controller; and receiving, from the memory controller, a duty control code configured to adjust a duty of the clock signal and a skew control code configured to adjust a skew of at least one of the first to fourth clock signals.

* * * * *